(12) United States Patent
Byun et al.

(10) Patent No.: US 11,127,340 B2
(45) Date of Patent: Sep. 21, 2021

(54) STAGE CIRCUIT AND SCAN DRIVER INCLUDING THE SAME

(71) Applicant: SAMSUNG DISPLAY CO., LTD., Yongin-si (KR)

(72) Inventors: Min Woo Byun, Yongin-si (KR); Jong Won Park, Yongin-si (KR); Chae Han Hyun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/009,880

(22) Filed: Sep. 2, 2020

(65) Prior Publication Data
US 2021/0225256 A1 Jul. 22, 2021

(30) Foreign Application Priority Data
Jan. 16, 2020 (KR) .................. 10-2020-0006108

(51) Int. Cl.
*G09G 5/00* (2006.01)
*G09G 3/30* (2006.01)
(Continued)

(52) U.S. Cl.
CPC ......... *G09G 3/2092* (2013.01); *G11C 19/184* (2013.01); *G11C 19/28* (2013.01);
(Continued)

(58) Field of Classification Search
CPC .... G11C 19/184; G11C 19/28; G09G 3/2092; G09G 2330/021; G09G 5/00; G09G 3/36; G09G 3/30; G06F 3/038
See application file for complete search history.

(56) References Cited

U.S. PATENT DOCUMENTS 10,950,157 B1 3/2021 Kim et al.
2017/0084245 A1* 3/2017 Hwang ................ G09G 3/3677
(Continued)

FOREIGN PATENT DOCUMENTS

JP 2004152069 5/2004
KR 1020040071834 8/2004
(Continued)

OTHER PUBLICATIONS

Extended European Search Report issued from the European Patent Office dated May 26, 2021 corresponding to European Patent Application No. 21151677.8 filed on Jan. 14, 2021.

*Primary Examiner* — Pegeman Karimi
(74) *Attorney, Agent, or Firm* — F. Chau & Associates, LLC

(57) ABSTRACT

A stage circuit includes a first substage circuit unit connected to first through third input terminals receiving a start signal, a first clock signal, and a second clock signal, respectively. The first substage circuit unit generates first and second operation signals based on the start signal and the first and second clock signals, and supplies a first scan signal to a first output terminal based on the first and second operation signals. The stage circuit further includes a second substage circuit unit connected to the third input terminal and a fourth input terminal receiving a third clock signal. The second substage circuit unit supplies a second scan signal to a second output terminal based on the first and second operation signals, the second clock signal, and the third clock signal. The first and second scan signals include a pulse of a low voltage level and a high voltage level, respectively.

20 Claims, 10 Drawing Sheets

(51) Int. Cl.
　　　　*G09G 3/20*　　　　(2006.01)
　　　　*G11C 19/28*　　　(2006.01)
　　　　*G11C 19/18*　　　(2006.01)

(52) U.S. Cl.
　　　　CPC .............. *G09G 2310/0278* (2013.01); *G09G 2330/021* (2013.01)

(56)　　　　　　References Cited

U.S. PATENT DOCUMENTS

| | | | |
|---|---|---|---|
| 2017/0193885 A1* | 7/2017 | Feng | G11C 19/184 |
| 2017/0287427 A1* | 10/2017 | Kim | G09G 3/3688 |
| 2018/0012550 A1* | 1/2018 | Lim | G11C 19/28 |
| 2018/0190204 A1 | 7/2018 | Shin et al. | |
| 2018/0240382 A1 | 8/2018 | Choi et al. | |
| 2018/0330673 A1* | 11/2018 | Kang | G11C 19/28 |

FOREIGN PATENT DOCUMENTS

| | | |
|---|---|---|
| KR | 10-2018-0081196 | 7/2018 |
| KR | 10-2018-0125670 | 11/2018 |

* cited by examiner

STAGE CIRCUIT AND SCAN DRIVER INCLUDING THE SAME

CROSS-REFERENCE TO RELATED APPLICATIONS

This application claims priority under 35 U.S.C. § 119 to Korean Patent Application No. 10-2020-0006108, filed on Jan. 16, 2020, the disclosure of which is incorporated by reference herein in its entirety.

TECHNICAL FIELD

Exemplary embodiments of the disclosure relate to a stage circuit and a scan driver including the same.

DISCUSSION OF THE RELATED ART

As information technology advances, the importance of a display device increases. Accordingly, the use of a display device such as, for example, a liquid crystal display (LCD) device or an organic light emitting diode (OLED) display device has been increasing.

Pixels included in the OLED display device may be implemented using NMOS and PMOS transistors to minimize a leakage current. Each of the NMOS and PMOS transistors included in such pixels may be driven by a scan signal. In this case, the scan driver may include a stage circuit that supplies a scan signal of a high level in correspondence with the NMOS transistor and that supplies a scan signal of a low level in correspondence with the PMOS transistor.

SUMMARY

When generating a scan signal of a high level, power consumption may increase due to continuous charging and discharging of some capacitors included in a stage circuit.

An object of exemplary embodiments of the disclosure is to provide a stage circuit for reducing power consumption that may occur due to a capacitor included in a stage circuit, and a scan driver including the same.

Another object of exemplary embodiments of the disclosure is to provide a stage circuit for simultaneously supplying a scan signal including a pulse of a low level and a scan signal including a pulse of a high level, and a scan driver including the same.

Objects of exemplary embodiments of the disclosure are not limited to the above-described objects, and other technical objects that are not described above will be clearly understood by those skilled in the art from the following description.

A stage circuit according to an exemplary embodiment of the disclosure for resolving the above-described object includes a first substage circuit unit connected to a first input terminal receiving a start signal, a second input terminal receiving a first clock signal, and a third input terminal receiving a second clock signal. The first substage circuit unit generates a first operation signal and a second operation signal in correspondence with the start signal, the first clock signal, and the second clock signal, and supplies a first scan signal to a first output terminal in correspondence with the first operation signal and the second operation signal. The stage circuit further includes a second substage circuit unit connected to the third input terminal and a fourth input terminal receiving a third clock signal. The second substage circuit unit supplies a second scan signal to a second output terminal in correspondence with the first operation signal, the second operation signal, the second clock signal, and the third clock signal. The first scan signal includes a pulse of a low voltage level, and the second scan signal includes a pulse of a high voltage level.

Each of the first substage circuit unit and the second substage circuit unit may be connected to a first power input terminal and a second power input terminal. The first power input terminal may receive first power set to a gate-off voltage, and the second power input terminal may receive second power set to a gate-on voltage.

The first substage circuit unit may include a first output unit connected to the third input terminal and the first power input terminal, and may supply the first scan signal to the first output terminal in response to a voltage of a first node and a voltage of a second node. The first substage circuit unit may further include a first driver connected to the first input terminal and the first power input terminal, and may control a voltage of a third node in response to the first clock signal and the second clock signal. The first substage circuit unit may further include a second driver connected to the second input terminal, the first power input terminal, the second power input terminal, and the third node, and may control the voltage of the first node and the voltage of the second node.

The first driver may include a first transistor connected between the first input terminal and the third node and having a gate electrode connected to the second input terminal, and a second transistor and a third transistor connected in series between the first power input terminal and the third node. A gate electrode of the second transistor may be connected to the third input terminal, and a gate electrode of the third transistor may be connected to the first node.

The first output unit may include a fourth transistor connected between the first power input terminal and the first output terminal and having a gate electrode connected to the first node, and a fifth transistor connected between the third input terminal and the first output terminal and having a gate electrode connected to the second node.

The second driver may include a sixth transistor connected between the second node and the third node and having a gate electrode connected to the second power input terminal, a seventh transistor connected between the first node and the second input terminal and having a gate electrode connected to the third node, an eighth transistor connected between the first node and the second power input terminal and having a gate electrode connected to the second input terminal, a first capacitor connected between the second node and the first output terminal, and a second capacitor connected between the first node and the first power input terminal.

The first operation signal may be the voltage of the first node, and the second operation signal may be the voltage of the third node.

The first operation signal may be the voltage of the first node, and the second operation signal may be the voltage of the second node.

The second substage circuit unit may include a second output unit connected to the fourth input terminal and the second power input terminal, and may supply the second scan signal to the second output terminal in response to a voltage of a fourth node and a voltage of a fifth node. The second substage circuit unit may further include a third driver connected to the third input terminal, the first power input terminal, the second power input terminal, a sixth node, and a seventh node, and may control the voltage of the fifth node in response to the second operation signal supplied to the sixth node and the first operation signal supplied to the seventh node. The second substage circuit may further include a fourth driver connected to the third input terminal, the second power input terminal, and the sixth node, and may control the voltage of the fourth node. The sixth node may be the same node as the third node, and the seventh node may be the same node as the first node.

The third driver may include a ninth transistor connected between the fifth node and the seventh node and having a gate electrode connected to the second power input terminal, a tenth transistor connected between the third input terminal and an eighth node and having a gate electrode connected to the fifth node, an eleventh transistor connected between the first power input terminal and the eighth node and having a gate electrode connected to the sixth node, and a third capacitor connected between the fifth node and the eighth node.

The fourth driver may include a twelfth transistor connected between the fifth node and a ninth node and having a gate electrode connected to the second power input terminal, a thirteenth transistor connected between the third input terminal and a tenth node and having a gate electrode connected to the ninth node, a fourteenth transistor connected between the fourth node and the tenth node and having a gate electrode connected to the third input terminal, and a fourth capacitor connected between the ninth node and the tenth node.

The second output unit may include a fifteenth transistor connected between the fourth node and the fourth input terminal and having a gate electrode connected to the fifth node, a sixteenth transistor connected between the fourth input terminal and the second output terminal and having a gate electrode connected to the fourth node, a seventeenth transistor connected between the second power input terminal and the second output terminal and having a gate electrode connected to the fifth node, and a fifth capacitor connected between the fourth input terminal and the fourth node.

The first clock signal and the second clock signal may have the same period, and a high voltage supply period may be set to be longer than a low voltage supply period in one period. The second clock signal may be set to a signal shifted by half a period from the first clock signal, and the third clock signal may be a signal having a phase inverted from a phase of the second clock signal.

The start signal may be a first scan signal of a previous first substage circuit unit, or a scan start signal.

A scan driver according to an exemplary embodiment of the disclosure for resolving the above-described object includes a plurality of stage circuits configured to supply a first scan signal including a pulse of a low voltage level to first scan lines and a second scan signal including a pulse of a high voltage level to second scan lines. Each of the plurality of stage circuits includes a first substage circuit unit connected to a first input terminal, and a second input terminal and a third input terminal receiving different clock signals, generates a first operation signal and a second operation signal in correspondence with voltages of the first input terminal, the second input terminal, and the third input terminal, and supplies the first scan signal to a first output terminal in correspondence with the first operation signal and the second operation signal. Each of the plurality of stage circuits further includes a second substage circuit unit connected to the third input terminal and a fourth input terminal receiving a clock signal, and supplies the second scan signal to a second output terminal in correspondence with the first operation signal, the second operation signal, a voltage of the third input terminal, and a voltage of the fourth input terminal.

The first substage circuit unit may include a first output unit connected to the third input terminal and a first power input terminal and supplying the first scan signal to the first output terminal in response to a voltage of a first node and a voltage of a second node, a first driver connected to the first input terminal, the second input terminal, a third input terminal, the first power input terminal, and controlling a voltage of a third node, and a second driver connected to the second input terminal, the first power input terminal, the second power input terminal, and the third node, and controlling the voltage of the first node and the voltage of the second node. The first power input terminal may supply a gate-off voltage and the second power input terminal may supply a gate-on voltage.

The second substage circuit unit may include a second output unit connected to the fourth input terminal and the second power input terminal, and supplying the second scan signal to the second output terminal in response to a voltage of a fourth node and a voltage of a fifth node, a third driver connected to the third input terminal, the first power input terminal, the second power input terminal, a sixth node, and a seventh node, and controlling the voltage of the fifth node in response to the second operation signal supplied to the sixth node and the first operation signal supplied to the seventh node, and a fourth driver connected to the third input terminal, the second power input terminal, and the sixth node, and controlling the voltage of the fourth node.

The second input terminal may receive a first clock signal, the third input terminal may receive a second clock signal, and the fourth input terminal may receive a third clock signal in an odd-numbered stage. The second input terminal may receive the second clock signal, the third input terminal may receive the first clock signal, and the fourth input terminal may receive the fourth clock signal in an even-numbered stage.

The first clock signal and the second clock signal may have the same period, and a high voltage supply period may be set to be longer than a low voltage supply period in one period. The second clock signal may be set to a signal shifted by half a period from the first clock signal, the third clock signal and the fourth clock signal may have the same period, a high voltage supply period may be set to be shorter than a low voltage supply period in one period, and the fourth clock signal may be set to a signal shifted by half a period from the third clock signal.

The third clock signal may be a signal having a phase inverted from a phase of the second clock signal, and the fourth clock signal may be a signal having a phase inverted from a phase of the first clock signal.

The stage circuit and the scan driver including the same according to exemplary embodiments of the disclosure may maintain a voltage of both ends of a capacitor included in the stage circuit as a high level to prevent continuous charging and discharging and to improve a power consumption characteristic.

In addition, the stage circuit and the scan driver including the same according to exemplary embodiments of the disclosure may simultaneously supply a scan signal of a high level and a scan signal of a low level using one stage. Therefore, a mount area of the stage circuit may be minimized or reduced, and manufacturing cost may be reduced.

The effect according to the exemplary embodiments is not limited by the details illustrated above, and various additional effects are included in the present disclosure.

BRIEF DESCRIPTION OF THE DRAWINGS

The above and other features of the disclosure will become more apparent by describing in further detail exemplary embodiments thereof with reference to the accompanying drawings, in which.

DETAILED DESCRIPTION OF THE EXEMPLARY EMBODIMENTS

Figure 1:
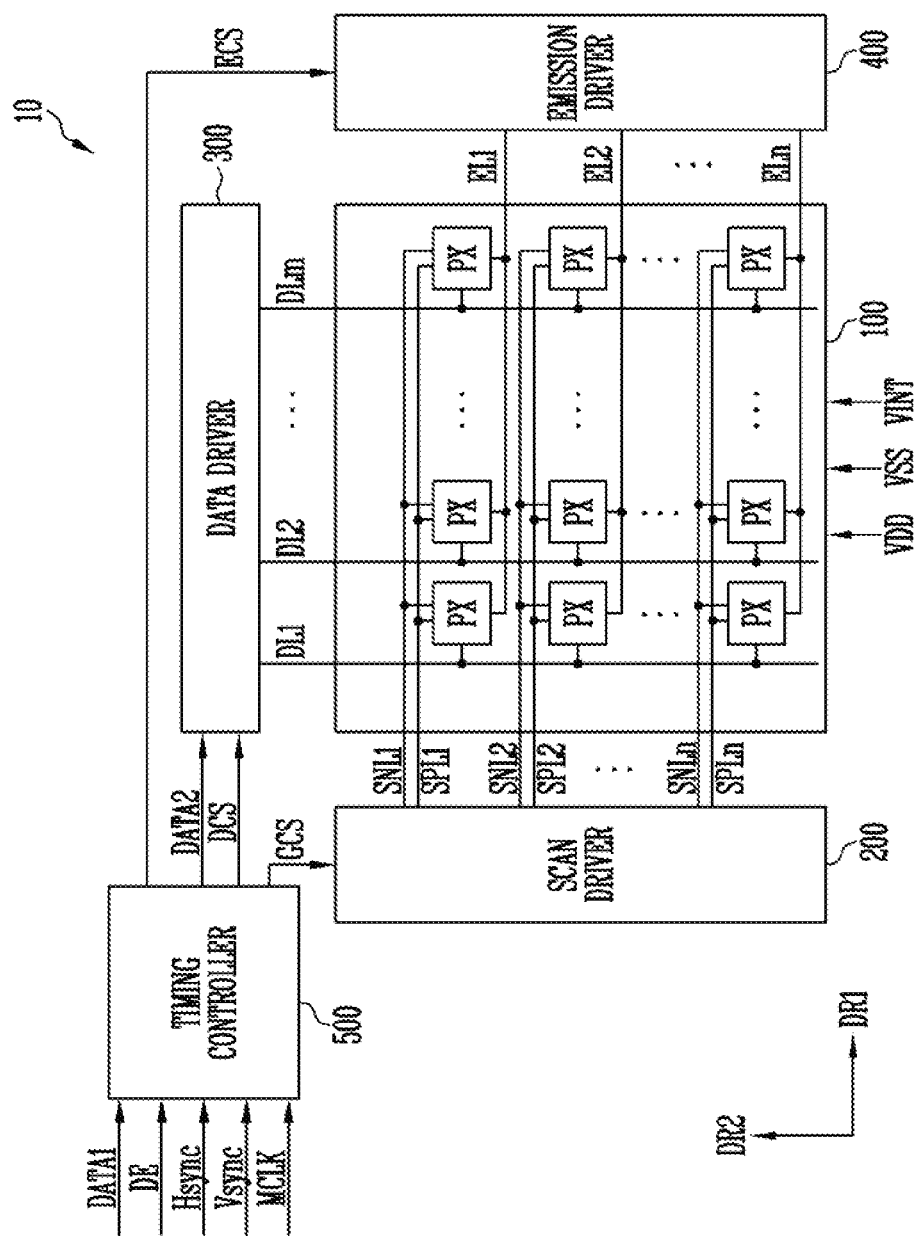
FIG. 1 is a diagram schematically illustrating a display device according to an exemplary embodiment.

Exemplary embodiments of the disclosure will be described more fully hereinafter with reference to the accompanying drawings. Like reference numerals may refer to like elements throughout the accompanying drawings It will be understood that when an element is referred to as being "on", "connected to", "coupled to", or "adjacent to" another element, it can be directly on, connected, coupled, or adjacent to the other element, or intervening elements may be present. It will also be understood that when an element is referred to as being "between" two elements, it can be the only element between the two elements, or one or more intervening elements may also be present. Other words used to describe the relationship between elements should be interpreted in a like fashion.

It will be further understood that the terms "first," "second," "third," etc. are used herein to distinguish one element from another, and the elements are not limited by these terms. Thus, a "first" element in an exemplary embodiment may be described as a "second" element in another exemplary embodiment.

It will be further understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

FIG. 1 is a diagram schematically illustrating a display device 10 according to an exemplary embodiment.

Referring to FIG. 1, the display device 10 according to an exemplary embodiment may include a display unit 100, a scan driver 200, a data driver 300, an emission driver 400, and a timing controller 500.

The display unit 100 may display an image. The display unit 100 may be implemented as a display panel. The display unit 100 may include various display elements such as, for example, an organic light emitting element (for example, an organic light emitting diode (OLED)). Hereinafter, for convenience of explanation, the display device 10 will be described as being an OLED display device including the organic light emitting element as the display element. However, the disclosure is not limited thereto. For example, in exemplary embodiments, the display device 10 may be various types of display devices such as, for example, a liquid crystal display (LCD) device, an electrophoretic display (EPD) device, and an inorganic light emitting display device.

The display unit 100 includes data lines DL1 to DLm (where m is a positive integer), first scan lines SPL1 to SPLn (where n is a positive integer), second scan lines SNL1 to SNLn, emission control lines EL1 to ELn, and pixels PX.

The pixels PX may be connected to the data lines DL1 to DLm, the first scan lines SPL1 to SPLn, the second scan lines SNL1 to SNLn, and the emission control lines EL1 to ELn, respectively. The pixels PX may emit or supply light of a predetermined luminance to the outside in correspondence with a data signal transferred through the data lines DL1 to DLm.

However, the pixels PX are not limited thereto. For example, the pixels PX may be electrically connected to first and second scan lines corresponding to adjacent rows (for example, first and second scan lines corresponding to a previous row of a row including a pixel PX and first and second scan lines corresponding to a subsequent row of the row including the pixel PX).

In addition, the pixels PX may be electrically connected to a first power line and a second power line to receive voltages of first power VDD and second power VSS. The first power VDD and the second power VSS may be power utilized to drive the pixels PX and drivers 200, 300, and 400. The first power VDD may supply a voltage of a high level, and the second power VSS may supply a voltage of a low level. In addition, the pixels PX may be electrically connected to an initialization power line to further receive initialization power VINT.

A detailed configuration and operation of the pixels PX will be described later with reference to FIGS. 2 and 3.

The scan driver 200 may generate a first scan signal and a second scan signal based on a gate control signal GCS, and provide the first and second scan signals to the first scan lines SPL1 to SPLn and the second scan lines SNL1 to SNLn.

The scan driver 200 may include a plurality of stage circuits, and each of the stage circuits may provide the first scan signals for the first scan lines SPL1 to SPLn and the second scan signals for the second scan lines SNL1 to SNLn.

The first scan signals provided to the first scan lines SPL1 to SPLn may be scan signals including a pulse of a low level, and the second scan signals provided to the second scan lines SNL1 to SNLn may be scan signals including a pulse of a high level.

For example, when the first scan signal is supplied to a gate electrode of an N-type transistor, the N-type transistor may be turned on. It may be assumed that a voltage of a sufficiently low level is applied to a source electrode of the N-type transistor compared to the gate electrode. The above-described N-type transistor may be an N-type metal oxide semiconductor (NMOS) transistor. In addition, when the second scan signal is supplied to a gate electrode of a P-type transistor, the P-type transistor may be turned on. It may be assumed that a voltage of a sufficiently high level is applied to a source electrode of the P-type transistor compared to the gate electrode. The P-type transistor may be a P-type metal oxide semiconductor (PMOS) transistor.

The gate control signal GCS is a signal for controlling an operation of the scan driver 200, and may include a gate start pulse (or a scan start signal) and one or more gate shift clocks. The gate start pulse may control a start timing of the first scan signals and the second scan signals, and the gate shift clock may refer to one or more clock signals for shifting the gate start pulse.

The scan driver 200 may be implemented as a shift register, but is not limited thereto. The scan driver 200 may be directly formed on one region of the display unit 100 (or one region of the display panel), or may be implemented as an integrated circuit and mounted on a flexible circuit board that is connected to the display unit 100.

The data driver 300 may generate a data signal based on image data DATA2 and a data control signal DCS, and provide the data signal to the data lines DL1 to DLm in a pixel row unit. The data control signal DCS may be a signal for controlling an operation of the data driver 300, and may include, for example, a load signal, a data start signal, a data clock signal, etc.

The emission driver 400 may generate an emission signal based on an emission control signal ECS and provide the emission signal to the emission control lines EL1 to ELn. For example, the emission driver 400 may sequentially provide the emission signals having a pulse of a turn-off level to the emission control lines EL1 to ELn. The emission driver 400 may be implemented as a shift register, but is not limited thereto.

The timing controller 500 may receive input image data DATA1 (for example, RGB data) and input control signals from the outside (for example, a graphic processor). The input image data DATA1 may include grayscale values corresponding to each pixel PX. The input control signals may include, for example, a vertical synchronization signal Vsync, a horizontal synchronization signal Hsync, a main clock signal MCLK, a data enable signal DE, etc.

The vertical synchronization signal Vsync may include a plurality of pulses, and may indicate that a previous frame period is ended and a current frame period is started based on a time point at which each of pulses is generated. An interval between adjacent pulses of the vertical synchronization signal Vsync may correspond to one frame period 1FP (refer to FIG. 3).

The horizontal synchronization signal Hsync may include a plurality of pulses, and may indicate that a previous horizontal period is ended and a new horizontal period is started based on a time point at which each of pulses is generated. An interval between adjacent pulses of the horizontal synchronization signal Hsync may correspond to one horizontal period 1H (refer to FIG. 5).

The timing controller 500 may generate the image data DATA2 based on the input image data DATA1, and generate the gate control signal GCS, the data control signal DCS, and the emission control signal ECS based on the input control signals. The timing controller 500 may provide the gate control signal GCS to the scan driver 200, provide the data control signal DCS and image data DATA2 to the data driver 300, and provide the emission control signal ECS to the emission driver 400.

Figure 2:
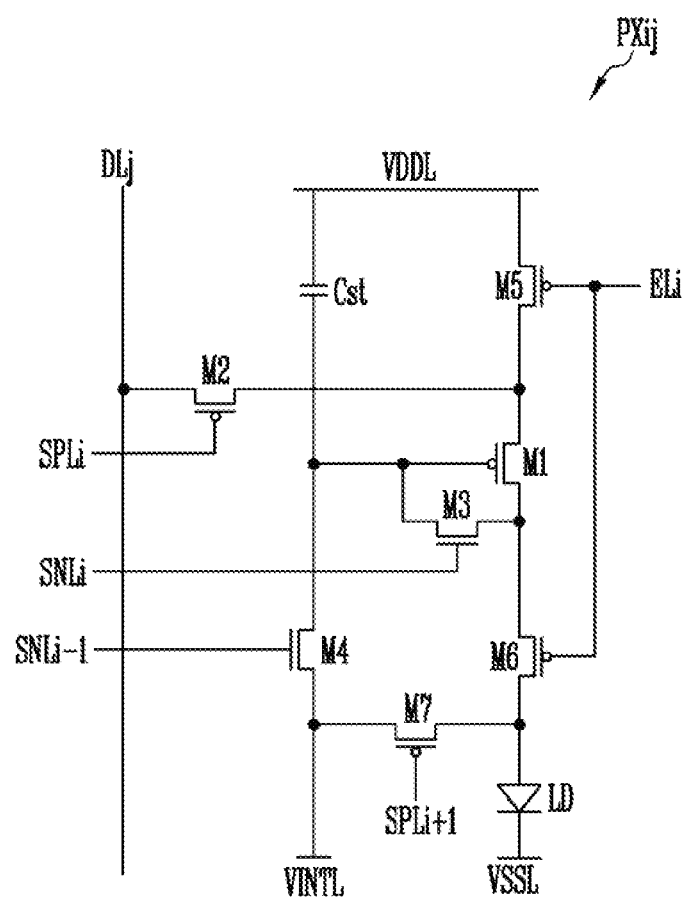
FIG. 2 is a diagram illustrating an example of a pixel included in the display device of FIG. 1.

FIG. 2 is a diagram illustrating an example of one of the pixels PX included in the display device of FIG. 1.

Referring to FIG. 2, a pixel PXij according to an exemplary embodiment may include first to seventh transistors M1, M2, M3, M4, M5, M6, and M7, a storage capacitor Cst, and a light emitting element LD.

According to exemplary embodiments, each of the pixels PX illustrated in FIG. 1 may be configured in the same manner as the pixel PXij illustrated in FIG. 2.

Referring to the first transistor M1, a first electrode may be connected to a first electrode of the second transistor M2, a second electrode may be connected to a first electrode of the third transistor M3, and a gate electrode may be connected to a second electrode of the third transistor M3. The first transistor M1 may also be referred to as a driving transistor.

Referring to the second transistor M2, the first electrode may be connected to the first electrode of the first transistor M1, a second electrode may be connected to a data line DLj, and a gate electrode may be connected to a first scan line SPLi. The second transistor M2 may also be referred to as a scan transistor.

Referring to the third transistor M3, the first electrode may be connected to the second electrode of the first transistor M1, the second electrode may be connected to the gate electrode of the first transistor M1, and a gate electrode may be connected to a second scan line SNLi. The third transistor M3 may also be referred to as a diode connection transistor.

Referring to the fourth transistor M4, a first electrode may be connected to a second electrode of the storage capacitor Cst, a second electrode may be connected to an initialization power line VINTL, and a gate electrode may be connected to a previous second scan line SNLi−1. The previous second scan line SNLi−1 may be a line providing a second scan signal to a previous pixel row. The fourth transistor M4 may also be referred to as a gate initialization transistor.

Referring to the fifth transistor M5, a first electrode may be connected to a first power line VDDL, a second electrode may be connected to the first electrode of the first transistor M1, and a gate electrode may be connected to an emission control line Eli. The fifth transistor M5 may also be referred to as a first emission control transistor.

Referring to the sixth transistor M6, a first electrode may be connected to the second electrode of the first transistor M1, a second electrode may be connected to an anode electrode of the light emitting element LD, and a gate electrode may be connected to the emission control line ELi. The sixth transistor M6 may also be referred to as a second emission control transistor.

Referring to the seventh transistor M7, a first electrode may be connected to the anode electrode of the light emitting element LD, a second electrode may be connected to the initialization power line VINTL, and a gate electrode may be connected to a next first scan line SPLi+1. The next first scan line SPLi+1 may be a line providing the first scan signal to a next pixel row. The seventh transistor M7 may also be referred to as an anode initialization transistor.

Referring to the storage capacitor Cst, a first electrode may be connected to the first power line VDDL and the second electrode may be connected to the gate electrode of the first transistor M1.

Referring to the light emitting element LD, the anode electrode may be connected to the second electrode of the sixth transistor M6, and a cathode electrode may be connected to a second power line VSSL. A voltage applied to the second power line VSSL may be set to be lower than a voltage applied to the first power line VDDL.

The light emitting element LD may be, for example, an organic light emitting diode, an inorganic light emitting diode, a quantum-dot light emitting diode, etc.

The first, second, fifth, sixth, and seventh transistors M1, M2, M5, M6, and M7 may be P-type transistors. Channels of the first, second, fifth, sixth, and seventh transistors M1, M2, M5, M6, and M7 may be configured of poly silicon. For example, a poly silicon transistor may be a low temperature poly silicon (LTPS) transistor. The poly silicon transistor may have high electron mobility, and thus, may have a fast driving characteristic.

The third and fourth transistors M3 and M4 may be N-type transistors. Channels of the third and fourth transistors M3 and M4 may be configured of an oxide semiconductor. An oxide semiconductor transistor is capable of a low temperature process and may have low charge mobility in comparison with the poly silicon. Therefore, a leakage current amount generated in a turn-off state of the oxide semiconductor transistor may be less than that of the poly silicon transistors.

In exemplary embodiments, the first scan line SPLi may be connected to the gate electrode of the seventh transistor M7, rather than the next first scan line SPLi+1.

In addition, in exemplary embodiments, the seventh transistor M7 may be configured of an oxide semiconductor transistor rather than the poly silicon. That is, the seventh transistor M7 may be an N-type transistor. One of the second scan line SNLi and a previous second scan line SNLi−1 may be connected to the gate electrode of the seventh transistor M7 by replacing the next first scan line SPLi+1.

Figure 3:
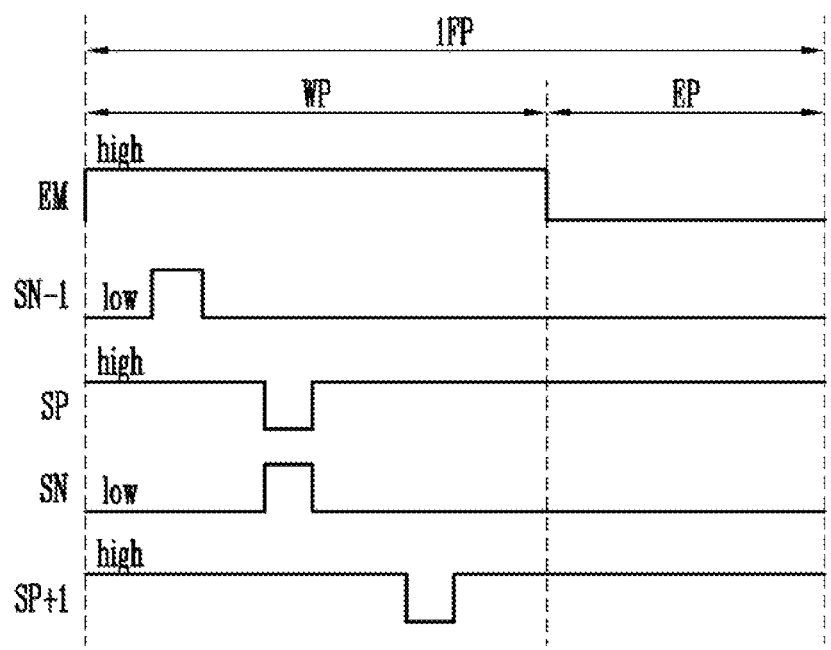
FIG. 3 is a diagram for describing a method of driving the pixel illustrated in FIG. 2 according to an exemplary embodiment.

FIG. 3 is a diagram for describing a method of driving the pixel PXij illustrated in FIG. 2 according to an exemplary embodiment.

Referring to FIGS. 2 and 3, a frame period 1FP may include a data write period WP and an emission period EP.

First, an emission signal EM of a turn-off level (for example, a high level) may be supplied to the emission control line ELi during the data write period WP. Therefore, the fifth and sixth transistors M5 and M6 may be turned off during the data write period WP.

Next, a previous second scan signal SN−1 of a turn-on level (for example, a high level) may be supplied to the previous second scan line SNLi−1. Therefore, the fourth transistor M4 may be turned on and the gate electrode of the first transistor M1 and the initialization power line VINTL may be connected to each other. A voltage of the gate electrode of the first transistor M1 may be initialized to an initialization voltage of the initialization power line VINTL and maintained by the storage capacitor Cst. The initialization voltage of the initialization power line VINTL may be a voltage sufficiently lower than the voltage of the first power line VDDL. For example, the initialization voltage may be a voltage equal to the voltage of the second power line VSSL or lower than the voltage of the second power line VSSL. Therefore, the first transistor M1 may be turned on.

Next, a first scan signal SP of a turn-on level (for example, a low level) may be supplied to the first scan line SPLi, and a second scan signal SN of a turn-on level (for example, a high level) may be supplied to the second scan line SNLi. Therefore, the second and third transistors M2 and M3 corresponding to the first scan line SPLi and the second scan line SNLi may be turned on. A data voltage applied to the data line DLj may be written to the storage capacitor Cst through the second, first, and third transistors M2, M1, and M3. That is, a data voltage corresponding to a grayscale value of the pixel PXij may be written to the storage capacitor Cst. At this time, the data voltage written to the storage capacitor Cst may be a voltage in which a decrease of a threshold voltage of the first transistor M1 is reflected.

Finally, a next first scan signal SP+1 of a turn-on level (for example, a low level) may be supplied to the next first scan line SPLi+1 and the seventh transistor M7 may be turned on. Therefore, a voltage of the anode electrode of the light emitting element LD may be initialized.

Thereafter, when the data write period WP is ended, the emission signal EM may be a turn-on level (for example, a low level), and the emission period EP may be started. The fifth and sixth transistors M5 and M6 may be turned on according to the emission signal EM of the turn-on level. Therefore, a driving current path connected to the first power line VDDL, the fifth, first, and sixth transistors M5, M1, and M6, the light emitting element LD, and the second power line VSSL may be formed, and a driving current may flow. A driving current amount may correspond to a data voltage stored in the storage capacitor Cst. At this time, since a driving current flows through the first transistor M1, the decrease of the threshold voltage of the first transistor M1 may be reflected. Therefore, since the decrease of the threshold voltage reflected in the data voltage stored in the storage capacitor Cst and the decrease of the threshold voltage reflected in the driving current offset each other, the driving current corresponding to the data voltage supplied through the data line DLj may flow regardless of the threshold voltage value of the first transistor M1. That is, the light emitting element LD may emit light at a desired luminance according to the above-described driving current amount in the emission period EP.

In an exemplary embodiment, for convenience of description, each of scan signals includes one pulse. However, the disclosure is not limited thereto. For example, in an exemplary embodiment, each of scan signals may include a plurality of pulses. In this case, a process of applying an on-bias voltage before the desired data voltage is written to the first transistor M1 may be included, and a hysteresis phenomenon of the pixel PXij may be improved.

Figure 4:
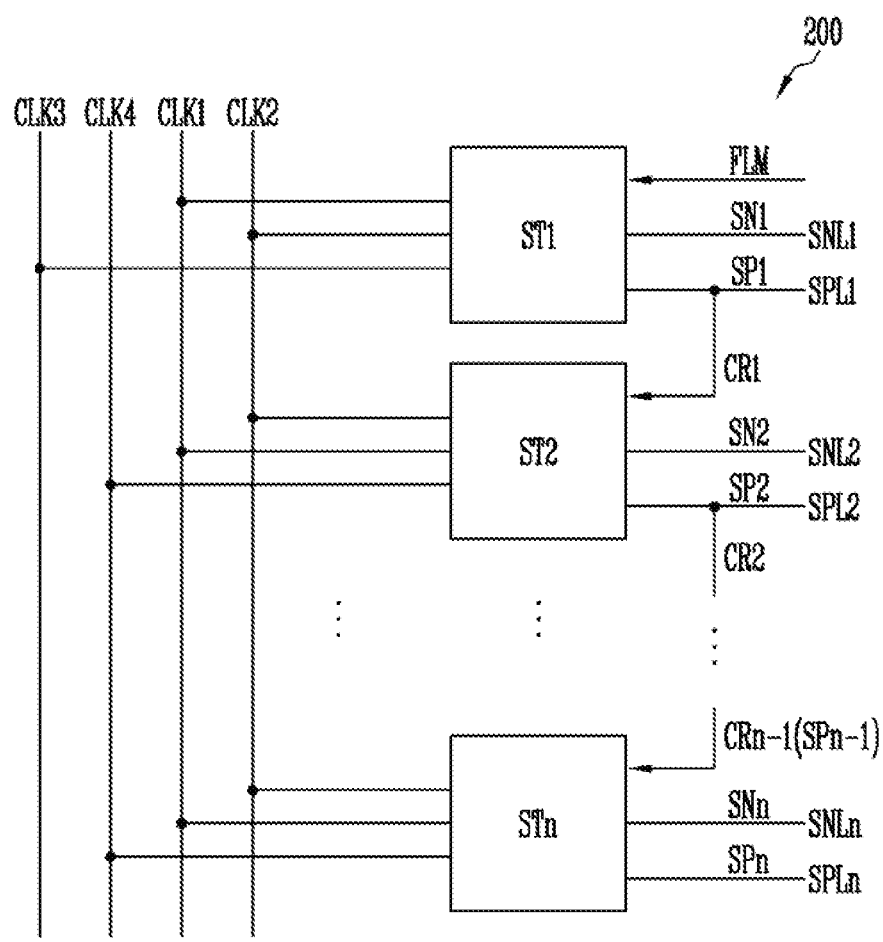
FIG. 4 is a diagram schematically illustrating a scan driver according to an exemplary embodiment.
Figure 5:
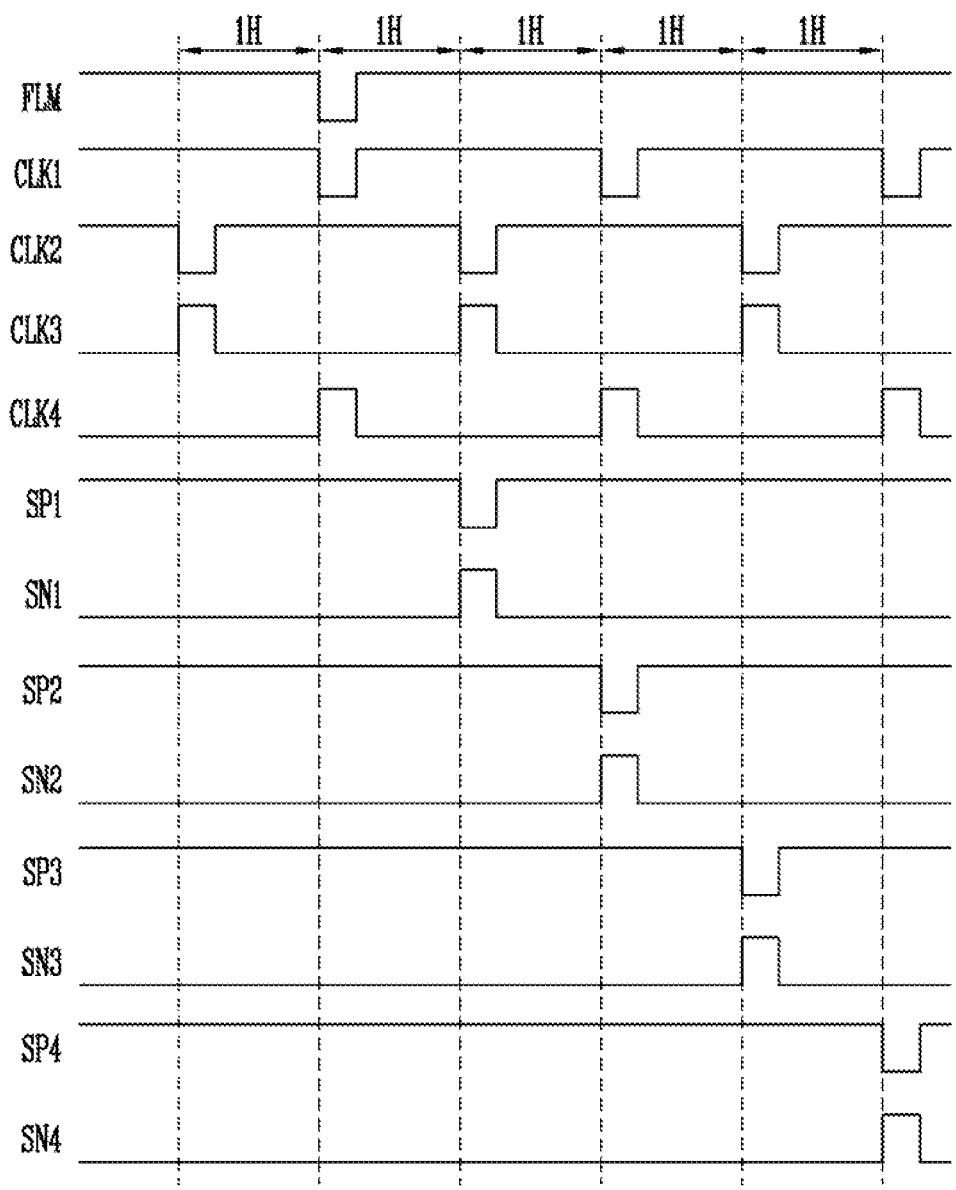
FIG. 5 is a waveform diagram schematically illustrating a scan signal of the scan driver of FIG. 4 according to an exemplary embodiment.

FIG. 4 is a diagram schematically illustrating the scan driver 200 according to an exemplary embodiment. FIG. 5 is a waveform diagram schematically illustrating the scan signal of the scan driver 200 of FIG. 4 according to an exemplary embodiment.

Referring to FIGS. 4 and 5, the scan driver 200 according to an exemplary embodiment may include a plurality of stage circuits ST1 to STn. Each of the stage circuits ST1 to STn may be connected to corresponding clock lines CLK1 to CLK4 and a previous end scan line (or a carry line). However, since a previous scan line of the first stage circuit ST1 is not present, the first stage circuit ST1 may be connected to a scan start line.

In addition, the stage circuits ST1 to STn may be connected to each other in a form of a shift register. Each of the stage circuits ST1 to STn may be connected to the first scan lines SPL1 to SPLn and the second scan lines SNL1 to SNLn, and may supply the first scan signals SP1 to SPn and the second scan signals SN1 to SNn to the first scan lines SPL1 to SPLn and the second scan lines SNL1 to SNLn in correspondence with a start signal. The start signal may be a scan start signal FLM or a first scan signal of a previous stage circuit.

For example, the first stage circuit ST1 may respectively supply the first scan signal SP1 (which may include a pulse of a low voltage level) and the second scan signal SN1 (which may include a pulse of a high voltage level) to first scan line SPL1 and the second scan line SNL1 connected to the first stage circuit ST1 in correspondence with the scan start signal FLM. The remaining stage circuits ST2 to STn may sequentially and respectively supply the first scan signals SP2 to SPn and the second scan signals SN2 to SNn to the first scan lines SPL2 to SPLn and the second scan lines SNL2 to SNLn connected thereto in correspondence with carry signals CR1 to CRn−1 supplied from a previous stage circuit. The carry signals CR1 to CRn−1 may correspond to the first scan signals SP1 to SPn−1 output from the previous stage circuits, respectively.

Each of the stage circuits ST1 to STn may receive three clock signals among the four clock signals CLK1 to CLK4 supplied to the scan driver 200.

For example, odd-numbered stage circuits ST1, . . . may receive the first clock signal CLK1, the second clock signal CLK2, and the third clock signal CLK3, and even-numbered stage circuit ST2, . . . may receive the first clock signal CLK1, the second clock signal CLK2, and the fourth clock signal CLK4. That is, while both the odd-numbered stage circuits ST1, . . . and the even-numbered stage circuit ST2, . . . may receive the first clock signal CLK1 and the second clock signal CLK2, the third clock signal CLK3 may be supplied to the odd-numbered stage circuits ST1, . . . , and the fourth clock signal CLK4 may be supplied to the even-numbered stage circuits ST2, . . . .

As shown in FIG. 5, the first clock signal CLK1 to the fourth clock signal CLK4 may be square wave signals that repeat a high level and a low level, and may be set to the same period.

The first clock signal CLK1 to the fourth clock signal CLK4 may be set to a period of two horizontal periods 2H. The first clock signal CLK1 to the fourth clock signal CLK4 may be set such that the high level and the low level have different widths during one period. For example, the first clock signal CLK1 and the second clock signal CLK2 may be set such that the low level has a narrower width than the high level. That is, the first clock signal CLK1 and the second clock signal CLK2 may include a pulse of a low level. In addition, the third clock signal CLK3 and the fourth clock signal CLK4 may be set such that the high level has a narrower width than the low level. That is, the third clock signal CLK3 and the fourth clock signal CLK4 may include a pulse of a high level.

The third clock signal CLK3 may be set to a signal inverting the second clock signal CLK2. For example, when the second clock signal CLK2 has a low level, the third clock signal CLK3 may have a high level, and when the second clock signal CLK2 has a high level, the third clock signal CLK3 may have a low level. In addition, the fourth clock signal CLK4 may be set to a signal inverting the first clock signal CLK1. In this case, the low level of the first clock signal CLK1 may overlap at least some of the low level of the third clock signal CLK3, and the low level of the second clock signal CLK2 may overlap at least some of the low level of the fourth clock signal CLK4.

However, the first to fourth clock signals CLK1 to CLK4 are not limited to the above description, and may be set to have various periods and duty ratios according to exemplary embodiments.

As shown in FIGS. 4 and 5, the first stage circuit ST1 may output the second clock signal CLK2 as the first scan signal SP1 and output the third clock signal CLK3 as the second scan signal SN1 after one horizontal period 1H in correspondence with the scan start signal FLM. In addition, the first stage circuit ST1 may supply the first scan signal SP1, which is the carry signal CR1, to the next stage circuit ST2.

The second stage circuit ST2 may output the first clock signal CLK1 as the first scan signal SP2 and output the fourth clock signal CLK4 as the second scan signal SN2 after one horizontal period 1H in correspondence with the carry signal CR1. In addition, the second stage circuit ST2 may supply the first scan signal SP2, which is the carry signal CR2, to the next stage circuit. The subsequent stage circuits also may output the first scan signals and the second scan signals by repeating the above-described process. That is, the first scan signals SP1 to SPn and the second scan signals SN1 to SNn output from the stage circuits ST1 to STn may be output in a period of one horizontal period 1H, respectively.

Figure 6:
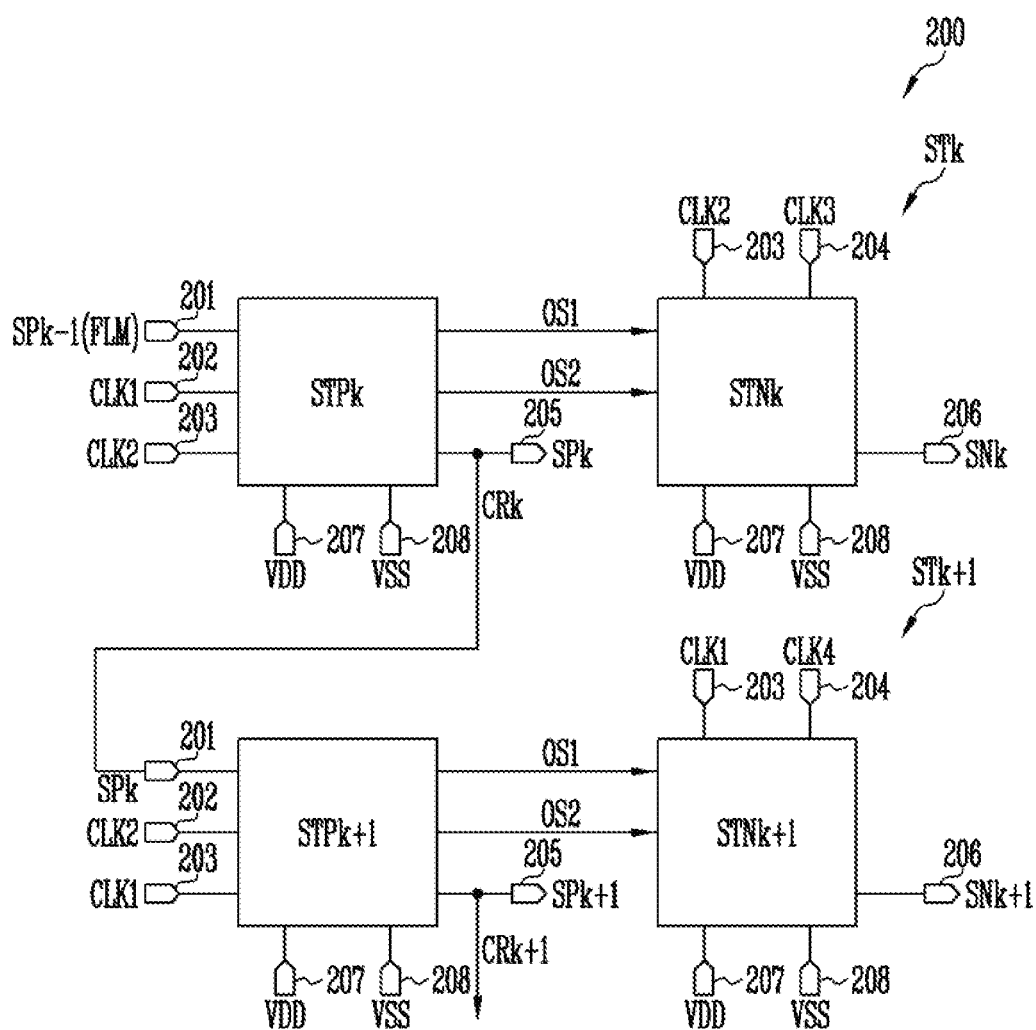
FIG. 6 is a diagram illustrating an example of stage circuits shown in FIG. 4 and connection stages of the stage circuits.

FIG. 6 is a diagram illustrating an example of stage circuits shown in FIG. 4 and connection stages of the stage circuits.

In FIG. 6, for convenience of description, a k-th stage circuit STk and a (k+1)-th stage circuit STk+1 are shown. The k-th stage circuit STk may be an odd-numbered stage circuit, and the (k+1)-th stage circuit STk+1 may be an even-numbered stage circuit. Hereinafter, a description will be given based on the k-th stage circuit STk. Since the (k+1)-th stage circuit STk+1 may be substantially the same as or similar to the k-th stage circuit STk, only differences thereof may be described for convenience of explanation.

Referring to FIG. 6, the stage circuits STk and STk+1 according to an exemplary embodiment may include first substage circuit units STPk and STPk+1 (where k is a positive integer) and second substage circuit units STNk and STNk+1. In addition, the stage circuits STk and STk+1 may include a first input terminal 201, a second input terminal 202, a third input terminal 203, a fourth input terminal 204, a first output terminal 205, a second output terminal 206, a first power input terminal 207, and a second power input terminal 208.

For example, the first substage circuit units STPk and STPk+1 may include the first input terminal 201, the second input terminal 202, the third input terminal 203, the first output terminal 205, the first power input terminal 207, and the second power input terminal 208, and the second substage circuit unit STNk and STNk+1 may include the third input terminal 203, the fourth input terminal 204, the second output terminal 206, the first power input terminal 207, and the second power input terminal 208.

The first input terminal 201 of the first substage circuit unit STPk may receive a first scan signal SPk−1 from a previous stage circuit. At this time, when the k-th stage circuit STk is set to the first stage circuit ST1 of FIG. 4, the scan start signal FLM may be supplied to the first input terminal 201.

The first input terminal 201 of the first substage circuit unit STPk+1 positioned in the next row may receive a carry signal CRk. The carry signal CRk may be a first scan signal SPk output from the first substage circuit unit STPk positioned in a previous row.

The second input terminal 202 may receive one of the first clock signal CLK1 and the second clock signal CLK2. For example, the second input terminal 202 of the k-th stage circuit STk may receive the first clock signal CLK1. In this case, the second input terminal 202 of the (k+1)-th stage circuit STk+1 may receive the second clock signal CLK2.

The third input terminal 203 may receive another of the first clock signal CLK1 and the second clock signal CLK2 supplied to the second input terminal 202. For example, when the first clock signal CLK1 is supplied to the second input terminal 202 of the k-th stage circuit STk, the third input terminal 203 may receive the second clock signal CLK2. In this case, the third input terminal 203 of the (k+1)-th stage circuit STk+1 may receive the first clock signal CLK1.

The fourth input terminal 204 of the second substage circuit unit STNk may receive one of the third clock signal CLK3 and the fourth clock signal CLK4. For example, the fourth input terminal 204 of the k-th stage circuit STk may receive the third clock signal CLK3. In this case, the fourth input terminal 204 of the (k+1)-th stage circuit STk+1 may receive the fourth clock signal CLK4.

The first output terminal 205 of the first substage circuit unit STPk may output the first scan signal SPk. The first scan signal SPk output through the first output terminal 205 may be supplied to the k-th first scan line. The first scan signal SPk output from the first output terminal 205 may be a signal having a pulse of a low level.

The first substage circuit unit STPk may output the first scan signal SPk through the first output terminal 205 and provide the first scan signal SPk as the carry signal CRk to the first substage circuit unit STPk+1 of a next row.

The second output terminal 206 of the second substage circuit unit STNk may output a second scan signal SNk. The second scan signal SNk output through the second output terminal 206 may be supplied to a k-th second scan line. The second scan signal SNk output from the second output terminal 206 may be a signal having a pulse of a high level.

The first power VDD may be applied to the first power input terminal 207, and the second power VSS may be applied to the second power input terminal 208. As described above, the first power VDD may supply a voltage of a high level, and the second power VSS may supply a voltage of a low level.

For example, when the stages STk and STk+1 of the scan driver 200 include a P-type transistor, a voltage of the first power VDD may be set to a gate-off voltage and a voltage of the second power VSS may be set to a gate-on voltage.

In addition, in exemplary embodiments, a high level of the clock signals CLK1 to CLK4 may be set to a gate-off voltage (for example, the voltage of the first power VDD), and a low level may be set to a gate-on voltage (for example, the voltage of the second power VSS).

A first operation signal OS1 and a second operation signal OS2 may be generated based on the signals supplied through the input terminals 201, 202, and 203 of the first substage circuit unit STPk and the power supplied through the power input terminals 207 and 208. For example, the first operation signal OS1 and the second operation signal OS2 may be generated based on the scan start signal FLM received through the first input terminal 201 of the first substrate circuit unit STPk, the first clock signal CLK1 received through the second input terminal 202 of the first substrate circuit unit STPk, and the second clock signal CLK2 received through the third input terminal 202 of the first substrate circuit unit STPk. The first scan signal SPk described above may be output based on the first operation signal OS1 and the second operation signal OS2.

The first substage circuit unit STPk may output the first scan signal SPk through the first output terminal 205 in correspondence with the first operation signal OS1 and the second operation signal OS2. In addition, the second substage circuit unit STNk may receive the first operation signal OS1 and the second operation signal OS2 from the first substage circuit unit STPk, and may output the second scan signal SNk through the second output terminal 206 based on the first operation signal OS1 and the second operation signal OS2. The first operation signal OS1 and the second operation signal OS2 will be described in further detail with reference to FIGS. 7 and 8.

Figure 7:
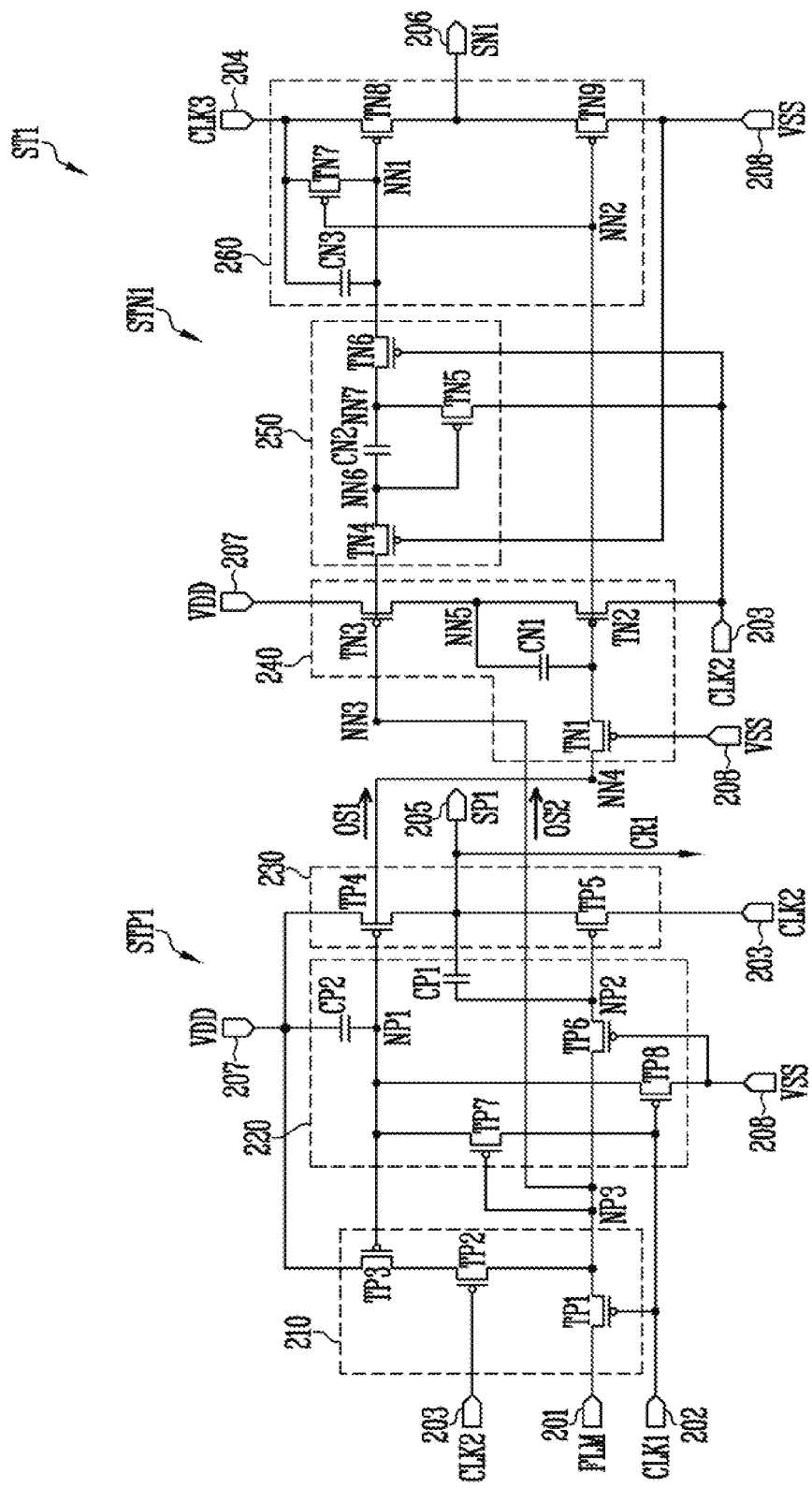
FIG. 7 is a circuit diagram illustrating one of the stage circuits shown in FIG. 4 according to an exemplary embodiment.

FIG. 7 is a circuit diagram illustrating one of the stage circuits shown in FIG. 4 according to an exemplary embodiment.

Hereinafter, for convenience of description, a description that the first clock signal CLK1 and the second clock signal CLK2 are supplied may mean that a gate-on voltage (for example, a low level voltage) is supplied, and a description that the first clock signal CLK1 and the second clock signal CLK2 are not supplied may mean that a gate-off voltage (for example, a high level voltage) is supplied. In addition, a description that the third clock signal CLK3 is supplied may mean that a gate-off voltage (for example, a high level voltage) is supplied, and a description that the third clock signal CLK3 is not supplied may mean that a gate-on voltage (for example, a low level voltage) is supplied.

Referring to FIG. 7, the first stage circuit ST1 of the scan driver 200 of FIG. 4 is exemplarily illustrated. Since the other stage circuits ST2 to STn of FIG. 4 may have a configuration substantially the same as that of the first stage circuit ST1, a repetitive description of such other stage circuits may be omitted for convenience of description.

The stage circuit ST1 may include a first substage circuit unit STP1 and a second substage circuit unit STN1.

The first substage circuit unit STP1 may include a first driver 210, a second driver 220, ad a first output unit 230.

The first substage circuit unit STP1 may include first to eighth transistors TP1 to TP8, and may include first and second capacitors CP1 and CP2.

The first substage circuit unit STP1 may be connected to the first input terminal 201, the second input terminal 202, the third input terminal 203, the first power input terminal 207, and the second power input terminal 208, and may output the first scan signal SP1 through the first output terminal 205.

The first output unit 230 may be connected to the third input terminal 203, the first power input terminal 207, and the first output terminal 205. The first output unit 230 may control a voltage supplied to the first output terminal 205 in correspondence with voltages of a first node NP1 and a second node NP2. For example, the first output unit 230 may electrically connect the second input terminal 202 or the first power input terminal 207 to the first output terminal 205 in correspondence with the voltages of the first node NP1 and the second node NP2. To this end, the first output unit 230 may include the fourth transistor TP4 and the fifth transistor TP5. Thus, the first output unit 230 may supply the first scan signal SP1 to the first output terminal 205 in response to a voltage of the first node NP1 and a voltage of the second node NP2.

The fourth transistor TP4 may be connected between the first power input terminal 207 and the first output terminal 205, and a gate electrode of the fourth transistor TP4 may be connected to the first node NP1. The fourth transistor TP4 may control a connection between the first power input terminal 207 and the first output terminal 205 in correspondence with a voltage applied to the first node NP1.

The fifth transistor TP5 may be connected between the first output terminal 205 and the third input terminal 203, and a gate electrode of the fifth transistor TP5 may be connected to the second node NP2. The fifth transistor TP5 may control a connection between the first output terminal 205 and the third input terminal 203 in correspondence with a voltage applied to the second node NP2. The first output unit 230 may be driven as a buffer. In addition, the fourth transistor TP4 and the fifth transistor TP5 may be configured as a plurality of transistors connected in parallel.

The first driver 210 may be connected to the first input terminal 201, the second input terminal 202, the third input terminal 203, and the first power input terminal 207. The first driver 210 may control a voltage of a third node NP3 in correspondence with signals supplied to the first to third input terminals 201, 202, and 203. For example, the first driver 210 may control the voltage of the third node NP3 in response to the scan start signal FLM supplied to the first input terminal 201, the first clock signal CLK1 supplied to the second input terminal 202, and the second clock signal CLK2 supplied to the third input terminal 203. To this end, the first driver 210 may include the first to third transistors TP1, TP2, and TP3.

The first transistor TP1 may be connected between the first input terminal 201 and the third node NP3, and a gate electrode of the first transistor TP1 may be connected to the second input terminal 202. The first transistor TP1 may control a connection between the first input terminal 201 and the third node NP3 in correspondence with a signal supplied to the second input terminal 202.

The second transistor TP2 and the third transistor TP3 may be connected in series between the third node NP3 and the first power input terminal 207. The second transistor TP2 may be positioned between the third transistor TP3 and the third node NP3, and a gate electrode of the second transistor TP2 may be connected to the third input terminal 203. The third transistor TP3 may control a connection between the third transistor TP3 and the third node NP3 in correspondence with a signal supplied to the third input terminal 203.

The third transistor TP3 may be positioned between the second transistor TP2 and the first power input terminal 207, and a gate electrode of the third transistor TP3 may be connected to the first node NP1. The third transistor TP3 may control a connection between the second transistor TP2 and the first power input terminal 207 in correspondence with the voltage of the first node NP1.

The second driver 220 may be connected to the second input terminal 202, the first power input terminal 207, and the second power input terminal 208. The second driver 220 may control the voltages of the first node NP1 and the second node NP2 in correspondence with voltages of the second input terminal 202 and the third node NP3. To this end, the second driver 220 may include the sixth transistor TP6, the seventh transistor TP7, the eighth transistor TP8, the first capacitor CP1, and the second capacitor CP2.

The first capacitor CP1 may be connected between the second node NP2 and the first output terminal 205. The first capacitor CP1 may store a voltage corresponding to a turn-on voltage and a turn-off voltage of the fifth transistor TP5.

The second capacitor CP2 may be connected between the first node NP1 and the first power input terminal 207. The second capacitor CP2 may store the voltage applied to the first node NP1.

The seventh transistor TP7 may be connected between the first node NP1 and the second input terminal 202, and a gate electrode of the seventh transistor TP7 may be connected to the third node NP3. The seventh transistor TP7 may control a connection between the first node NP1 and the second input terminal 202 in correspondence with the voltage of the third node NP3.

The eighth transistor TP8 may be connected between the first node NP1 and the second power input terminal 208, and a gate electrode of the eighth transistor TP8 may be connected to the second input terminal 202. The eighth transistor TP8 may control a connection between the first node NP1 and the second power input terminal 208 in correspondence with a signal of the second input terminal 202.

The sixth transistor TP6 may be connected between the third node NP3 and the second node NP2, and a gate electrode of the sixth transistor TP6 may be connected to the second power input terminal 208. The second power VSS may be applied to the gate electrode of the sixth transistor TP6 through the second power input terminal 208, and an electrical connection may be maintained between the third node NP3 and the second node NP2 while maintaining a turn-on state.

The sixth transistor TP6 may limit a voltage drop width of the third node NP3 in correspondence with the voltage of the second node NP2. That is, even though the voltage of the second node NP2 drops to a voltage lower than the second power VSS by coupling of the first capacitor CP1, the voltage of the third node NP3 is not lowered more than a voltage obtained by subtracting a threshold voltage of the sixth transistor TP6 from the second power VSS. Therefore, since the voltage of the third node NP3 is maintained, an excessive bias voltage is prevented from being applied to the transistors connected to the third node NP3, and thus, reliability of the stage circuit ST1 may be improved.

The second substage circuit unit STN1 may include a third driver 240, a fourth driver 250, and a second output unit 260. The second substage circuit unit STN1 may include ninth to seventeenth transistors TN1 to TN9 and may include third to fifth capacitors CN1 to CN3.

The second substage circuit unit STN1 may be connected to the third input terminal 203, the fourth input terminal 204, the first power input terminal 207, and the second power input terminal 208, and may output the second scan signal SN1 through the second output terminal 206. The second substage circuit unit STN1 may receive the first operation signal OS1 and the second operation signal OS2 from the first substage circuit unit STP1. The second scan signal SN1 supplied to the second output terminal 206 by the second substage circuit unit STN1 may be based on the first operation signal OS1, the second operation signal OS2, the second clock signal CLK2, and the third clock signal CLK3. The second scan signal SN1 may include a pulse of a high voltage level.

The second output unit 260 may be connected to the fourth input terminal 204, the second power input terminal 208, and the second output terminal 206. The second output unit 260 may control a voltage supplied to the second output terminal 206 in correspondence with voltages of a fourth node NN1 and a fifth node NN2. For example, the second output unit 260 may electrically connect the fourth input terminal 204 or the second power input terminal 208 to the second output terminal 206 in correspondence with the voltages of the fourth node NN1 and the fifth node NN2. Thus, the second output unit 260 may supply the second scan signal SN1 to the second output terminal 206 in response to a voltage of the fourth node NN1 and a voltage of the fifth node NN2. To this end, the second output unit 260 may include the fifteenth transistor TN7, the sixteenth transistor TN8, the seventeenth transistor TN9, and the fifth capacitor CN3.

The fifteenth transistor TN7 may be connected between the fourth input terminal 204 and the fourth node NN1. In addition, a gate electrode of the fifteenth transistor TN7 may be connected to the fifth node NN2. The fifteenth transistor TN7 may be turned on or turned off in correspondence with the voltage of the fifth node NN2.

The sixteenth transistor TN8 may be connected between the fourth input terminal 204 and the second output terminal 206, and a gate electrode of the sixteenth transistor TN8 may be connected to the fourth node NN1. The sixteenth transistor TN8 may be turned on or turned off in correspondence with the voltage of the fourth node NN1. When the sixteenth transistor TN8 is turned on, a voltage (that is, a high level voltage) of the third clock signal CLK3 supplied to the fourth input terminal 204 may be output as the second scan signal SN1.

The seventeenth transistor TN9 may be connected between the second output terminal 206 and the second power input terminal 208. In addition, a gate electrode of the seventeenth transistor TN9 may be connected to the fifth node NN2. The seventeenth transistor TN9 may be turned on or turned off in correspondence with the voltage of the fifth node NN2.

The fifth capacitor CN3 may be connected between the fourth input terminal 204 and the fourth node NN1. The fifth capacitor CN3 may store the voltage of the fourth node NN1.

When the fifth node NN2 is set to a low level voltage, the fifteenth transistor TN7 may be set to a turn-on state. When the fifteenth transistor TN7 is set to the turn-on state, the fourth input terminal 204 and the fourth node NN1 are electrically connected to each other, and thus, the voltage of the fourth node NN1 may be set to a voltage of the fourth input terminal 204. Therefore, when the fifteenth transistor TN7 is set to the turn-on state, voltages of the gate electrode of the sixteenth transistor TN8 and a first electrode connected to the fourth input terminal 204 may be set to be the same, and thus, the sixteenth transistor TN8 may be set to a turn-off state.

The third driver 240 may receive the first operation signal OS1 and the second operation signal OS2 from the first substage circuit unit STP1. For example, a seventh node NN4 of the third driver 240 may be electrically connected to the first node NP1 of the first substage circuit unit STP1, and may receive the voltage of the first node NP1 as the first operation signal OS1. For example, the first node NP1 and the seventh node NN4 may electrically be the same node (e.g., may be a common node), and thus, a voltage value may be the same. However, a connection structure of the first node NP1 and the seventh node NN4 is not limited thereto, and other circuit elements such as, for example, a transistor or a capacitor may be further included between the first node NP1 and the seventh node NN4.

In addition, a sixth node NN3 of the third driver 240 may be electrically connected to the third node NP3 of the first substage circuit unit STP1, and thus, in an exemplary embodiment, may receive the voltage of the third node NP3 as the second operation signal OS2. For example, the third node NP3 and the sixth node NN3 may electrically be the same node (e.g., may be a common node), and thus, a voltage value may be the same. However, a connection structure of the third node NP3 and the sixth node NN3 is not limited thereto, and other circuit elements such as, for example, a transistor or a capacitor may be further included between the third node NP3 and the sixth node NN3.

The third driver 240 may be connected to the first power input terminal 207, the second power input terminal 208, and the third input terminal 203, and may control a voltage of an eighth node NN5 in correspondence with voltages of the first operating signal OS1 and the second operating signal OS2 provided to the sixth node NN3 and the seventh node NN4. Further, the third driver 240 may control the voltage of the fifth node NN2 in response to the second operation signal OS2 supplied to the sixth node NN3 and the first operation signal OS1 supplied to the seventh node NN4. To this end, the third driver 240 may include the ninth transistor TN1, the tenth transistor TN2, the eleventh transistor TN3, and the third capacitor CN1.

The ninth transistor TN1 may be connected between the seventh node NN4 and the fifth node NN2, and a gate electrode of the ninth transistor TN1 may be connected to the second power input terminal 208. The second power VSS may be applied to the gate electrode of the ninth transistor TN1 through the second power input terminal 208, and an electrical connection may be maintained between the seventh node NN4 and the fifth node NN2 while maintaining a turn-on state.

The ninth transistor TN1 may limit a voltage drop width of the seventh node NN4 in correspondence with the voltage of the fifth node NN2. That is, even though the voltage of the fifth node NN2 drops to a voltage lower than the second power VSS by coupling of the third capacitor CN1, the voltage of the seventh node NN4 is not lowered more than a voltage obtained by subtracting a threshold voltage of the ninth transistor TN1 from the second power VSS. Therefore, since the voltage of the seventh node NN4 is maintained, an excessive bias voltage is prevented from being applied to the transistors connected to the seventh node NN4, and thus, the reliability of the stage circuit ST1 may be improved.

The tenth transistor TN2 may be connected between the eighth node NN5 and the third input terminal 203. The tenth transistor TN2 may control an electrical connection between the eighth node NN5 and the third input terminal 203 while being turned on or turned off in correspondence with the voltage of the fifth node NN2.

The eleventh transistor TN3 may be connected between the first power input terminal 207 and the eighth node NN5. The eleventh transistor TN3 may control an electrical connection between the first power input terminal 207 and the eighth node NN5 while being turned on or turned off in correspondence with the voltage of the sixth node NN3.

The third capacitor CN1 may be connected between the eighth node NN5 and the fifth node NN2. The third capacitor CN1 may store a voltage corresponding to the fifth node NN2.

The eighth node NN5 included in the third driver 240 periodically receives the second clock signal CLK2 from the third input terminal 203 when the fifth node NN2 is set to the low level voltage. When the second clock signal CLK2 is supplied to the eighth node NN5, the voltage of the fifth node NN2 may periodically drop to a voltage lower than a voltage (for example, the voltage of the second power VSS) by the coupling of the third capacitor CN1. As described above, when the voltage of the fifth node NN2 periodically drops, a driving characteristic of the transistors TN2, TN7, and TN9 connected to the fifth node NN2 may be improved.

In addition, when the sixth node NN3 is set to the low level voltage, the third driver 240 may supply the voltage of the first power VDD to the eighth node NN5. When the voltage of the first power VDD is supplied to the eighth node NN5, the voltage of the fifth node NN2 may be stably maintained by the coupling of the third capacitor CN1.

The fourth driver 250 may be connected to the sixth node NN3, and may control a voltage of the fourth node NN1 in correspondence with the second clock signal CLK2 supplied to the third input terminal 203 and the voltage of the second power VSS supplied to the second power input terminal 208. To this end, the fourth driver 250 may include the twelfth transistor TN4, the thirteenth transistor TN5, the fourteenth transistor TN6, and the fourth capacitor CN2.

The twelfth transistor TN4 may be connected between the sixth node NN3 and a ninth node NN6, and a gate electrode of the twelfth transistor TN4 may be connected to the second power input terminal 208. The second power VSS may be applied to the gate electrode of the twelfth transistor TN4 through the second power input terminal 208, and an electrical connection may be maintained between the sixth node NN3 and the ninth node NN6 while maintaining a turn-on state.

The twelfth transistor TN4 may limit a voltage drop width of the sixth node NN3 in correspondence with a voltage of the ninth node NN6. That is, even though the voltage of the ninth node NN6 drops to a voltage lower than the second power VSS by coupling of the fourth capacitor CN2, the voltage of the sixth node NN3 is not lowered more than a voltage obtained by subtracting a threshold voltage of the twelfth transistor TN4 from the second power VSS. Therefore, since the voltage of the sixth node NN3 is maintained, an excessive bias voltage is prevented from being applied to the transistors connected to the sixth node NN3, and thus, the reliability of the stage circuit ST1 may be improved.

The fourth capacitor CN2 may be connected between the ninth node NN6 and a tenth node NN7. That is, a first terminal of the fourth capacitor CN2 may be connected to the ninth node NN6, and a second terminal may be connected to the tenth node NN7.

The thirteenth transistor TN5 may be connected between the tenth node NN7 and the third input terminal 203, and a gate electrode of the thirteenth transistor TN5 may be connected to the ninth node NN6. The thirteenth transistor TN5 may be turned on or turned off in correspondence with the voltage of the ninth node NN6.

The fourteenth transistor TN6 may be connected between the tenth node NN7 and the fourth node NN1, and a gate electrode of the fourteenth transistor TN6 may be connected to the third input terminal 203. The fourteenth transistor TN6 may be turned on when the second clock signal CLK2 is supplied to the third input terminal 203 to electrically connect the tenth node NN7 and the fourth node NN1 to each other.

The first to eighth transistors TP1 to TP8 and the ninth to seventeenth transistors TN1 to TN9 may be, for example, P-type transistors.

Figure 8:
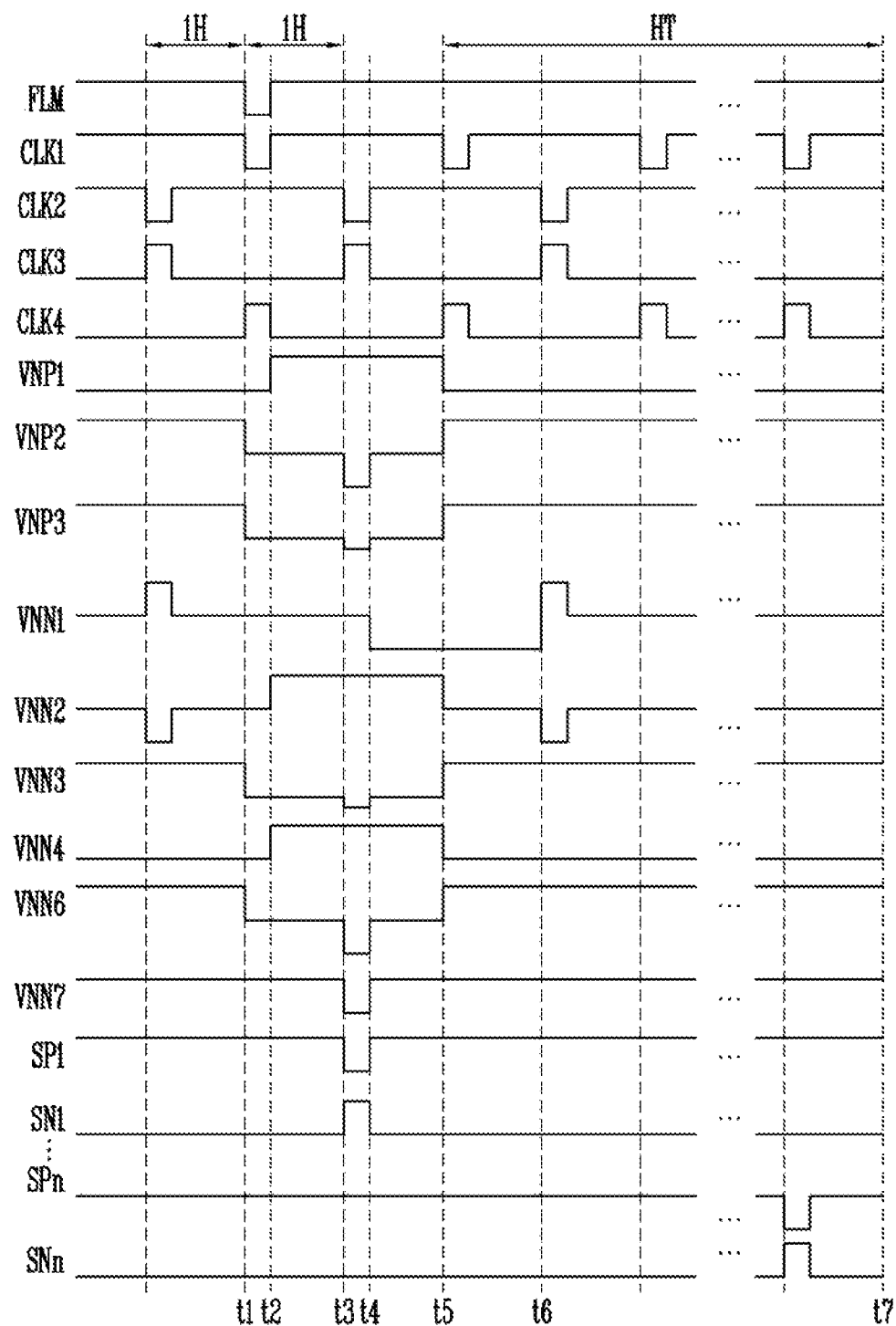
FIG. 8 is a waveform diagram for describing a method of driving the stage circuit shown in FIG. 7 according to an exemplary embodiment.

FIG. 8 is a waveform diagram for describing a method of driving the stage circuit shown in FIG. 7 according to an exemplary embodiment. In FIG. 8, for convenience of description, an operation process may be described using the first stage circuit ST1.

In FIG. 8, VNP1, VNP2, and VNP3 indicate a voltage of the first node NP1, a voltage of the second node NP2, and a voltage of the third node, respectively. Similarly, VNN1, VNN2, VNN3, VNN4, VNN6, and VNN7 indicate a voltage of the fourth node NN1, a voltage of the fifth node NN2, a voltage of the sixth node NN3, a voltage of the seventh node NN4, a voltage of the ninth node NN6, and a voltage of the tenth node NN7, respectively.

Referring to FIGS. 4, 7 and 8, the scan start signal FLM supplied to the first input terminal 201 may be supplied to be synchronized with the first clock signal CLK1 supplied to the second input terminal 202. In addition, when the scan start signal FLM is supplied, the first input terminal 201 may be set to a voltage of a low level (for example, the voltage of the second power VSS), and when the scan start signal FLM is not supplied, the first input terminal 201 may be set to a voltage of a high level (for example, the voltage of the first power VDD).

As described above, the first substage circuit unit STP1 and the second substage circuit unit STN1 of the stage circuit ST1 may output the first scan signal SP1 and the second scan signal SN1, respectively. Hereinafter, for convenience of description, operations of the first substage circuit unit STP1 and the second substage circuit unit STN1 may be separately described. First to sixth time points t1 to t6, which will be described later, may be time points common to the operation process of the first substage circuit unit STP1 and the second substage circuit unit STN1.

First, the operation process of the first substage circuit unit STP1 is described in detail. At the first time point t1, the scan start signal FLM may be supplied to the first input terminal 201.

When the first clock signal CLK1 is supplied, the first transistor TP1 and the eighth transistor TP8 may be turned on. When the first transistor TP1 is turned on, the first input terminal 201 and the third node NP3 may be electrically connected to each other. Since the sixth transistor TP6 is set to the turn-on state in most periods, the second node NP2 may maintain an electrical connection with the third node NP3.

When the first input terminal 201 and the third node NP3 are electrically connected to each other, the voltage VNP3 of the third node NP3 and the voltage VNP2 of the second node NP2 may be set to a low level by the scan start signal FLM supplied to the first input terminal 201. When the voltages VNP2 and VNP3 of the second node NP2 and the third node NP3 are set to the low level, the fifth transistor TP5 and the seventh transistor TP7 may be turned on.

When the fifth transistor TP5 is turned on, the third input terminal 203 and the first output terminal 205 may be electrically connected to each other. The third input terminal 203 may be set to a voltage of a high level (that is, the second clock signal CLK2 is not supplied), and thus, a voltage of a high level is also output to the first output terminal 205. When the seventh transistor TP7 is turned on, the second input terminal 202 and the first node NP1 may be electrically connected to each other. According to the first clock signal CLK1 supplied to the second input terminal 202, the voltage VNP1 of the first node NP1 may be set to a low level.

In addition, when the first clock signal CLK1 is supplied, the eighth transistor TP8 may be turned on. When the eighth transistor TP8 is turned on, a voltage of the second power input terminal 208 may be supplied to the first node NP1. The voltage of the second power input terminal 208 may be the voltage of the second power VSS, and may be set to a voltage the same as or similar to a low level voltage of the first clock signal CLK1. Therefore, the first node NP1 may stably maintain a low level voltage.

When the first node NP1 is set to a voltage of a low level, the third transistor TP3 and the fourth transistor TP4 may be turned on. When the third transistor TP3 is turned on, the first power input terminal 207 and the second transistor TP2 may be electrically connected to each other. Since the second transistor TP2 is set to a turn-off state, the third node NP3 may stably maintain a voltage of a low level even though the third transistor TP3 is turned on. When the fourth transistor TP4 is turned on, a voltage of the first power input terminal 207 may be supplied to the first output terminal 205. The voltage of the first power input terminal 207 may be the voltage of the first power VDD and may be set to a voltage the same as or similar to that of a voltage of a high level supplied to the third input terminal 203. Therefore, the first output terminal 205 may stably maintain a voltage of a high level.

Thereafter, at the second time point t2, supply of the scan start signal FLM and the first clock signal CLK1 may be stopped. When the supply of the first clock signal CLK1 is stopped, the first transistor TP1 and the eighth transistor TP8 may be turned off. At this time, the fifth transistor TP5 and the seventh transistor TP7 may maintain a turn-on state in correspondence with the voltage stored in the first capacitor CP1. That is, the second node NP2 and the third node NP3 may maintain a voltage of a low level by the voltage stored in the first capacitor CP1.

When the fifth transistor TP5 maintains a turn-on state, the first output terminal 205 and the third input terminal 203 may maintain an electrical connection. When the seventh transistor TP7 maintains a turn-on state, the first node NP1 may maintain an electrical connection with the second input terminal 202. A voltage of the second input terminal 202 may be set to a voltage of a high level in correspondence with the stopping of the supply of the first clock signal CLK1, and thus, the first node NP1 may also be set to a voltage of a high level. When a voltage of a high level is supplied to the first node NP1, the third transistor TP3 and the fourth transistor TP4 may be turned off.

Thereafter, at the third time point t3, the second clock signal CLK2 may be supplied to the third input terminal 203. At this time, since the fifth transistor TP5 is set to a turn-on state, the second clock signal CLK2 supplied to the third input terminal 203 may be supplied to the first output terminal 205. In this case, the first output terminal 205 may output the second clock signal CLK2 to the first scan line SPL1 as the first scan signal SP1 of a turn-on level (for example, a low level).

When the second clock signal CLK2 is supplied to the first output terminal 205, the voltage of the second node NP2 drops to a voltage lower than a voltage of the second power input terminal 208 by the coupling of the first capacitor CP1, and thus, the fifth transistor TP5 may stably maintain a turn-on state.

As described above, even though the voltage VNP2 of the second node NP2 drops, the voltage VNP3 of the third node NP3 is not lowered more than a voltage obtained by subtracting a threshold voltage of the sixth transistor TP6 from the second power VSS by the sixth transistor TP6.

Thereafter, at the fourth time point t4, supply of the second clock signal CLK2 may be stopped after the first scan signal SP1 of a turn-on level is output. When the supply of the second clock signal CLK2 is stopped, the first output terminal 205 may output a voltage of a high level. In addition, the voltage VNP2 of the second node NP2 may rise to the voltage of the second power input terminal 208 approximately in correspondence with the voltage of the high level of the first output terminal 205.

Thereafter, at the fifth time point t5, the first clock signal CLK1 may be supplied. When the first clock signal CLK1 is supplied, the first transistor TP1 and the eighth transistor TP8 may be turned on. When the first transistor TP1 is turned on, the first input terminal 201 and the third node NP3 may be electrically connected to each other. At this time, the scan start signal FLM may not be supplied to the first input terminal 201, and thus, may be set to a voltage of a high level. Therefore, when the sixth transistor TP6 is turned on, a voltage of a high level may be supplied to the third node NP3 and the second node NP2, and thus, the fifth transistor TP5 and the seventh transistor TP7 may be turned off.

When the eighth transistor TP8 is turned on, the voltage of the second power input terminal 208 may be supplied to the first node NP1, and thus, the third transistor TP3 and fourth transistor TP4 may be turned on. When the fourth transistor TP4 is turned on, the voltage of the first power input terminal 207 may be supplied to the first output terminal 205. Thereafter, the third transistor TP3 and the fourth transistor TP4 may maintain a turn-on state in correspondence with the voltage charged in the second capacitor CP2, and thus, the first output terminal 205 stably receives the voltage of the first power input terminal 207.

In addition, at the sixth time point t6, the second transistor TP2 may be turned on when the second clock signal CLK2 is supplied. At this time, since the third transistor TP3 is set to a turn-on state, the voltage of the first power input terminal 207 may be supplied to the third node NP3 and the second node NP2. In this case, the fifth transistor TP5 and the seventh transistor TP7 may stably maintain a turn-off state.

Next, the operation process of the second substage circuit unit STN1 is described in detail. Since the gate electrodes of the ninth transistor TN1 and the twelfth transistor TN4 may be connected to the second power input terminal 208, and the ninth transistor TN1 and the twelfth transistor TN4 are turned on during most of periods, a specific description of the ninth and twelfth transistors TN1 and TN4 will be omitted except for a special case.

As described above, the second substage circuit unit STN1 may receive the first operation signal OS1 and the second operation signal OS2 from the first substage circuit unit STP1. The first operation signal OS1 may be the voltage VNP1 of the first node NP1 of the first substage circuit unit STP1, and the second operation signal OS2 may be the voltage VNP3 of the third node NP3 of the first substage circuit unit STP1.

The first operation signal OS1 may be provided to the seventh node NN4 of the second substage circuit unit STN1, and the second operation signal OS2 may be provided to the sixth node NN3 of the second substage circuit unit STN1. For example, the voltage VNP1 of the first node NP1 may be the same as a voltage VNN4 of the seventh node NN4, and the voltage VNP2 of the second node NP2 may be the same as a voltage VNN3 of the sixth node NN3.

First, at the first time point t1, the voltage VNP3 of the third node NP3 may be set to a low level by the scan start signal FLM supplied to the first substage circuit unit STP1, and thus, the second operation signal OS2 transferred to the sixth node NN3 may be a voltage of a low level. The voltage VNP1 of the first node NP1 may also be set to a low level, and the first operation signal OS1 transferred to the seventh node NN4 may be a voltage of a low level.

When the second operation signal OS2 is supplied to the sixth node NN3 and the sixth node NN3 is set to a low voltage level, the eleventh transistor TN3 and the thirteenth transistor TN5 may be turned on.

When the eleventh transistor TN3 is turned on, the voltage of the first power VDD may be supplied to the eighth node NN5. When the voltage of the first power VDD is supplied to the eighth node NN5, the voltage of the fifth node NN2 may be stably maintained by the coupling of the third capacitor CN1.

When the thirteenth transistor TN5 is turned on, a second terminal (for example, the tenth node NN7) of the fourth capacitor CN2 and the third input terminal 203 may be electrically connected to each other. At this time, since the second clock signal CLK2 of a high level is applied to the gate electrode of the fourteenth transistor TN6, the fourteenth transistor TN6 may be turned off. Therefore, the fourth node NN1 may maintain a voltage of a previous period.

When the first operation signal OS1 is supplied to the seventh node NN4 and the seventh node NN4 is set to a low voltage level, the tenth transistor TN2, the fifteenth transistor TN7, and the seventeenth transistor TN9 may be turned on.

When the tenth transistor TN2 is turned on, the third input terminal 203 and the eighth node NN5 may be electrically connected to each other.

When the fifteenth transistor TN7 is turned on, the fourth node NN1 and the fourth input terminal 204 may be electrically connected to each other. At this time, the fourth input terminal 204 may be set to a low voltage level, and thus, the fourth node NN1 may be set to a low voltage level.

When the seventeenth transistor TN9 is turned on, the voltage of the second power VSS may be supplied to the second output terminal 206.

Thereafter, at the second time point t2, the first operation signal OS1 of a high level voltage may be supplied. That is, the seventh node NN4 may be set to a high level voltage. When the seventh node NN4 is set to the high voltage level, the fifth node NN2 may be set to a high voltage level. When the fifth node NN2 is set to the high voltage level, the tenth transistor TN2, the fifteenth transistor TN7, and the seventeenth transistor TN9 may be turned off.

Thereafter, at the third time point t3, the third clock signal CLK3 may be supplied to the fourth input terminal 204, and the second clock signal CLK2 may be supplied to the third input terminal 203. As described above, the third clock signal CLK3 may include a pulse of a high level voltage, and may be a signal inverted from the second clock signal CLK2.

When the second clock signal CLK2 is supplied to the third input terminal 203, the second clock signal CLK2 may be supplied to the second terminal (for example, the tenth node NN7) of the fourth capacitor CN2 via the thirteenth transistor TN5. Then, the voltage of the sixth node NN3 may drop to a voltage lower than that of the second power VSS by coupling of the fourth capacitor CN2. When the voltage of the sixth node NN3 drops, the thirteenth transistor TN5 may stably maintain a turn-on state and a driving characteristic thereof may be improved.

In addition, when the second clock signal CLK2 is supplied to the third input terminal 203, the fourteenth transistor TN6 may be turned on. When the fourteenth transistor TN6 is turned on, the second clock signal CLK2 may be supplied to the fourth node NN1. In this case, the fourth node NN1 may be set to a low voltage level, and thus, the sixteenth transistor TN8 may be turned on. At this time, the fifteenth transistor TN7 may maintain a turn-off state by the voltage of the fifth node NN2.

When the sixteenth transistor TN8 is turned on, the third clock signal CLK3 supplied to the fourth input terminal 204 may be supplied to the second output terminal 206. The third clock signal CLK3 supplied to the second output terminal 206 may be supplied to the first second scan line SNL1 as the second scan signal SN1.

Thereafter, at the fourth time point t4, supply of the third clock signal CLK3 to the fourth input terminal 204 may be stopped, and supply of the second clock signal CLK2 to the third input terminal 203 may be stopped. When the supply of the third clock signal CLK3 is stopped, the voltage of the fourth input terminal 204 may drop from a high voltage level to a low voltage level. Then, the voltage of the fourth node NN1 may drop to a voltage lower than a low level voltage by coupling of the fifth capacitor CN3, and thus, the sixteenth transistor TN8 may maintain a turn-on state. When the sixteenth transistor TN8 maintains the turn-on state, a low voltage level supplied to the fourth input terminal 204 may be supplied to the second output terminal 206. That is, at the fourth time point t4, supply of the second scan signal SN1 may be stopped.

Thereafter, at the fifth time point t5, the first operation signal OS1 of a voltage of a low level may be supplied and the second operation signal OS2 of a voltage of a high level may be supplied. That is, the seventh node NN4 may be set to a low voltage level, and the sixth node NN3 may be set to a high voltage level.

When the sixth node NN3 is set to the high voltage level, the eleventh transistor TN3 and the thirteenth transistor TN5 may be turned off. In addition, when the seventh node NN4 is set to the low voltage level, the tenth transistor TN2, the fifteenth transistor TN7, and the seventeenth transistor TN9 may be turned on.

Thereafter, at the sixth time point t6, the second clock signal CLK2 may be supplied to the third input terminal 203, and the third clock signal CLK3 may be supplied to the fourth input terminal 204.

At this time, since the tenth transistor TN2 is turned on, when the second clock signal CLK2 is supplied to the third input terminal 203, the second clock signal CLK2 may be supplied to the eighth node NN5. Then, the voltage of the fifth node NN2 may drop by the coupling of the third capacitor CN1. That is, the voltage of the fifth node NN2 may drop to a voltage lower than the voltage of the second power VSS. Therefore, the seventeenth transistor TN9 may stably maintain a turn-on state and a driving characteristic thereof may be improved.

Since the fifteenth transistor TN7 maintains a turn-on state at the sixth time point t6, the third clock signal CLK3 supplied to the fourth input terminal 204 may be supplied to the fourth node NN1, and thus, the fourth node NN1 may rise to a high voltage level. When the fourth node NN1 is set to the high voltage level, the sixteenth transistor TN8 may be turned off. Therefore, the second output terminal 206 may maintain the voltage of the second power VSS regardless of the third clock signal CLK3 supplied to the fourth input terminal 204.

As a result, the stage circuit ST1 may output the first scan signal SP1 and the second scan signal SN1 in correspondence with the scan start signal FLM supplied in synchronization with the first clock signal CLK1. For example, the first substage circuit unit STP1 of the stage circuit ST1 may output the second clock signal CLK2 as the first scan signal SP1 in correspondence with the voltage of the first node NP1 (or the first operation signal OS1) and the voltage of the second node NP2 (or the second operation signal OS2). In addition, the second substage circuit unit STN1 of the stage circuit ST1 may receive the first operation signal OS1 and the second operation signal OS2 from the first substage circuit unit STP1, control the voltages of the fourth node NN1 and the fifth node NN2 based on the first operation signal OS1 and the second operation signal OS2, and output the third clock signal CLK3 as the second scan signal SN1 in correspondence with the voltage of the fourth node NN1 and the voltage of the fifth node NN2.

The first scan signal SP1 output at the third time point t3 may be transferred to the next stage circuit ST2 as the carry signal CR1. That is, the next stage circuit ST2 may receive the first scan signal SP1 to be synchronized with the second clock signal CLK2. The next stage circuit ST2 may output the first scan signal SP2 of a turn-on level (for example, a low level) to the second first scan line SPL2 to be synchronized with the first clock signal CLK1, and output the second scan signal SN2 of a turn-on level (for example, a high level) to the second second scan line SNL2. The other stage circuits ST3 to STn may also sequentially output the first scan signals SP3 to SPn of a turn-on level to the first scan lines SPL3 to SPLn and sequentially output the second scan signals SN3 to SNn of a turn-on level to the second scan lines SNL3 to SNLn while repeating the above-described process.

Since the stage circuit ST1 according to exemplary embodiments may simultaneously supply the first scan signal SP1 of a low level and the second scan signal SN1 of a high level using one stage, a mount area of the stage circuit may be minimized or reduced, and manufacturing cost may be reduced in the display device.

In addition, the stage circuit ST1 according to exemplary embodiments may prevent the fourth capacitor CN2 from being unnecessarily charged and discharged, thereby improving power consumption of the stage circuit ST1 and the scan driver 200 including the same.

For example, in a first period HT after the fifth time point t5, voltages of both terminals of the fourth capacitor CN2 may maintain a high voltage level. That is, both of the voltage of the ninth node NN6, which is a first terminal of the fourth capacitor CN2, and the voltage of the tenth node NN7, which is a second terminal of the fourth capacitor CN2, may be set to the high voltage level.

As described above, at the fifth time point t5, the second operation signal OS2 of a high voltage level may be supplied, and thus, the sixth node NN3 may be set to a high voltage level. Since the twelfth transistor TN4 maintains a turn-on state, the ninth node NN6 may also be set to a high voltage level. Meanwhile, since the tenth node NN7 maintains a high voltage level after the fourth time point t4, both ends of the fourth capacitor CN2 may maintain a high voltage level in the first period HT after the fifth time point t5. For example, the first period HT may be a period from the fifth time point t5 to a time point when an output of the last scan signals SPn and SNn of a corresponding frame is ended (for example, the seventh time point t7), but is not limited thereto. For example, the first period HT may be a period until the corresponding frame is ended, and both of the voltage of the ninth node NN6 and the voltage of the tenth node NN7 of the stage circuit ST1 may be set to a high voltage level during a corresponding period. In addition, the first period HT may be a period before the scan start signal FLM is supplied to the stage circuit ST1 in a next frame.

When voltage levels of both ends of the fourth capacitor CN2 are different, a voltage corresponding to the difference may be charged in the fourth capacitor CN2. Thereafter, when the difference of the voltage levels changes, the voltage charged in the fourth capacitor CN2 may be discharged. When such charging and discharging continues in an unnecessary period, power consumption of the scan driver 200 may increase. However, according to exemplary embodiments, since the voltages of both ends of the fourth capacitor CN2 are maintained as the high voltage level after the fifth time point t5 (or the first period HT), unnecessary charging and discharging of the fourth capacitor CN2 does not occur, and power consumption of the stage circuit ST1 and the scan driver 200 including the same may be improved.

Figure 9:
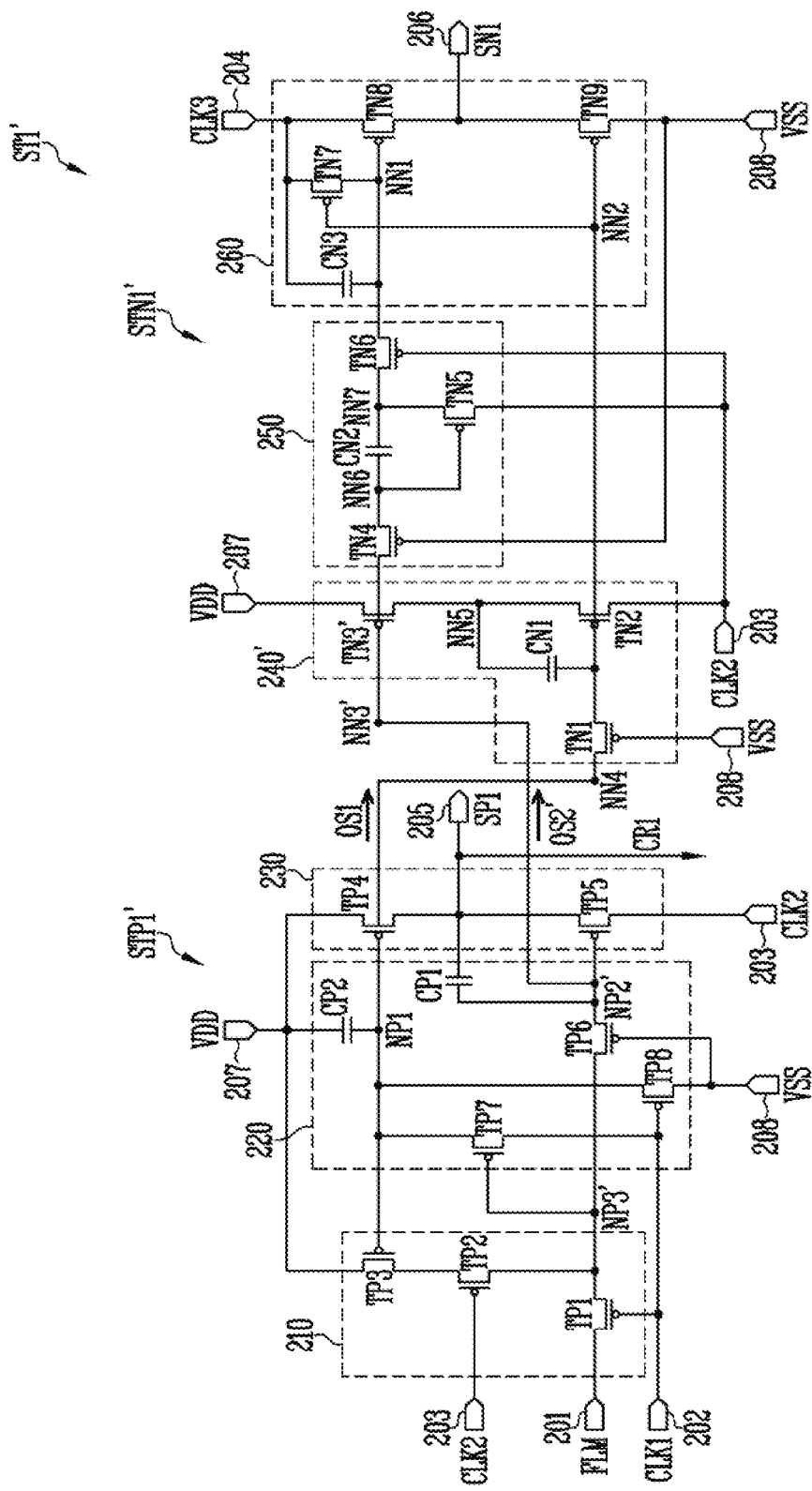
FIG. 9 is a circuit diagram illustrating a stage circuit according to an exemplary embodiment.

FIG. 9 is a circuit diagram illustrating a stage circuit according to an exemplary embodiment. For convenience of explanation, a further description of elements and technical aspects previously described will be omitted.

Referring to FIG. 9, a stage circuit ST1' may include a first substage circuit unit STP1' and a second substage circuit unit STN1'. The first substage circuit unit STP1' may generate the first operation signal OS1 and a second operation signal OS2' and provide the first operation signal OS1 and the second operation signal OS2' to the second substage circuit unit STN1'. The second operation signal OS2' may be a voltage of a second node NP2' of the first substage circuit unit STP1', and may be transferred to an eleventh transistor TN3' of a third driver 240' through a sixth node NN3'.

As described above, the gate electrode of the sixth transistor TP6 may be connected to the second power input terminal 208 to receive the voltage of the second power VSS, thereby maintaining a turn-on state. That is, a voltage level of a third node NP3' and a voltage level of the second node NP2' may be substantially the same or similar.

Since a voltage of the second node NP2' may drop to a voltage lower than that of the second power VSS by the coupling of the first capacitor CP1, a driving characteristic of transistors connected to the second node NP2' may be improved.

That is, the stage circuit ST1' shown in FIG. 9 may operate identically or similarly to the stage circuit ST1 shown in FIG. 7, and thus, a further detailed description thereof is omitted.

Figure 10:
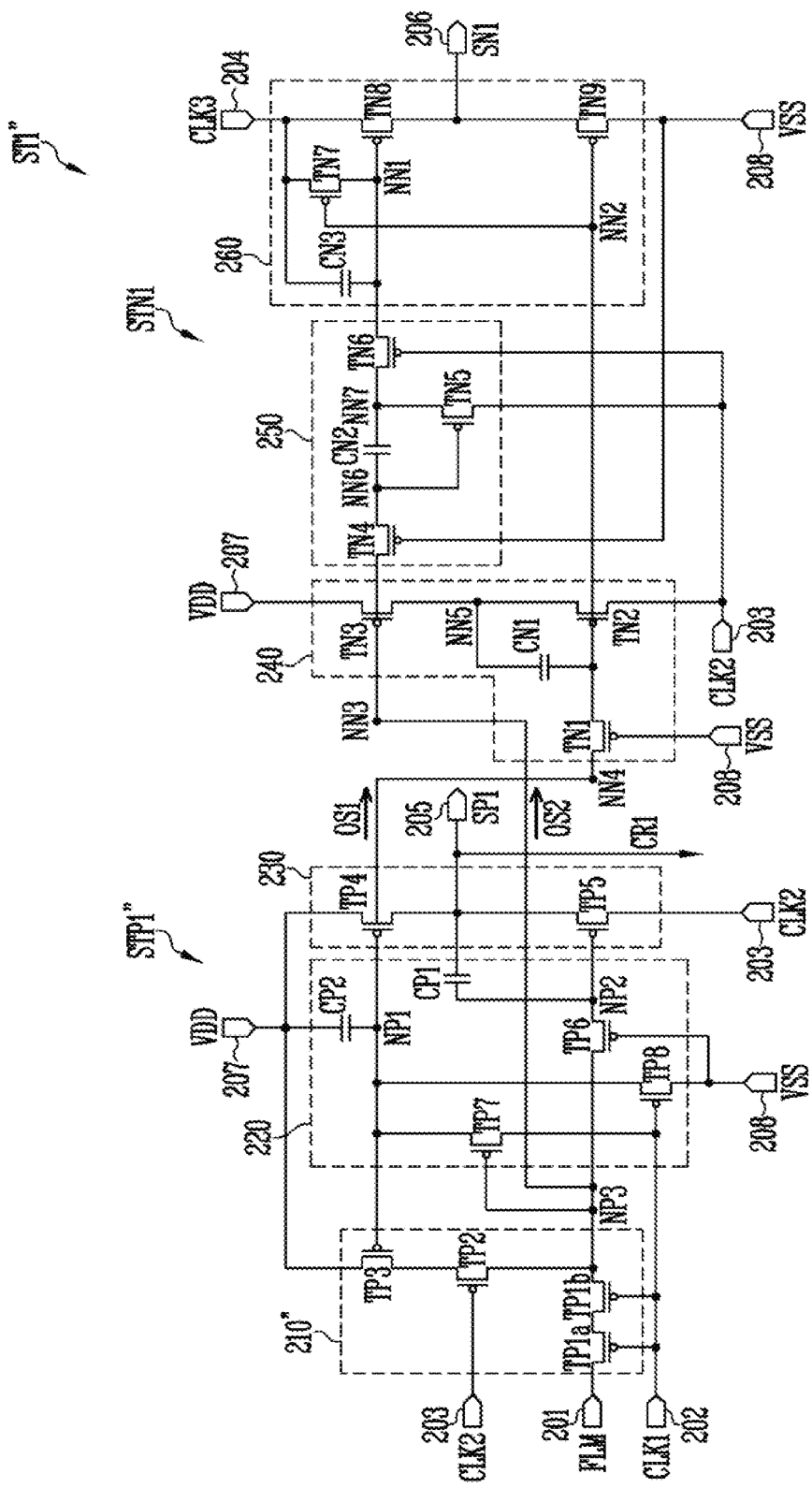
FIG. 10 is a circuit diagram illustrating a stage circuit according to an exemplary embodiment.

FIG. 10 is a circuit diagram illustrating a stage circuit according to an exemplary embodiment. For convenience of explanation, a further description of elements and technical aspects previously described will be omitted Referring to FIG. 10, a first substage circuit unit STP1" of the stage circuit ST1" may include a first driver 210", the second driver 220, and the first output unit 230.

The first driver 210" may include first transistors TP1a and TP1b, the second transistor TP2, and the third transistor TP3.

The first transistors TP1a and TP1b may be configured as a plurality of sub-transistors. For example, the first transistors TP1a and TP1b may be configured as a first sub-transistor TP1a and a second sub-transistor TP1b. When the first transistors TP1a and TP1b are configured as the plurality of sub-transistors, occurrence of a leakage current of the first transistors TP1a and TP1b may be prevented or reduced. In addition, the first transistors TP1a and TP1b may be robust to the first clock signal CLK1 of a strong bias, thereby preventing deterioration. Thus, reliability of the first transistors TP1a and TP1b may be improved.

In exemplary embodiments, a structure of the plurality of sub-transistors may be applied to the other transistors TP2 to TN9 in addition to the first transistors TP1a and TP1b.

Since a structure and an operation method of the stage circuit ST1" are the same as or similar to those of the stage circuit ST1 described above, a further detailed description thereof is omitted.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:
1. A stage circuit, comprising:
a first substage circuit unit connected to a first input terminal which receives a start signal, a second input terminal which receives a first clock signal, and a third input terminal which receives a second clock signal,
wherein the first substage circuit unit generates a first operation signal and a second operation signal based on the start signal, the first clock signal, and the second clock signal, and supplies a first scan signal to a first output terminal based on the first operation signal and the second operation signal; and a second substage circuit unit connected to the third input terminal and a fourth input terminal which receives a third clock signal, wherein the second substage circuit unit supplies a second scan signal to a second output terminal based on the first operation signal, the second operation signal, the second clock signal, and the third clock signal, wherein the first scan signal includes a pulse of a low voltage level, and the second scan signal includes a pulse of a high voltage level.

2. The stage circuit according to claim 1, wherein each of the first substage circuit unit and the second substage circuit unit is connected to a first power input terminal and a second power input terminal, the first power input terminal receives a first power set to a gate-off voltage, and the second power input terminal receives a second power set to a gate-on voltage.

3. The stage circuit according to claim 2, wherein the first substage circuit unit comprises:

a first output unit connected to the third input terminal and the first power input terminal, wherein the first output unit supplies the first scan signal to the first output terminal in response to a voltage of a first node and a voltage of a second node;

a first driver connected to the first input terminal and the first power input terminal, wherein the first driver controls a voltage of a third node in response to the first clock signal and the second clock signal; and a second driver connected to the second input terminal, the first power input terminal, the second power input terminal, and the third node, wherein the second driver controls the voltage of the first node and the voltage of the second node.

4. The stage circuit according to claim 3, wherein the first driver comprises:

a first transistor connected between the first input terminal and the third node and having a gate electrode connected to the second input terminal; and a second transistor and a third transistor connected in series between the first power input terminal and the third node, wherein a gate electrode of the second transistor is connected to the third input terminal, and a gate electrode of the third transistor is connected to the first node.

5. The stage circuit according to claim 3, wherein the first output unit comprises:

a first transistor connected between the first power input terminal and the first output terminal and having a gate electrode connected to the first node; and a second transistor connected between the third input terminal and the first output terminal and having a gate electrode connected to the second node.

6. The stage circuit according to claim 3, wherein the second driver comprises:

a first transistor connected between the second node and the third node and having a gate electrode connected to the second power input terminal;

a second transistor connected between the first node and the second input terminal and having a gate electrode connected to the third node;

a third transistor connected between the first node and the second power input terminal and having a gate electrode connected to the second input terminal;

a first capacitor connected between the second node and the first output terminal; and a second capacitor connected between the first node and the first power input terminal.

7. The stage circuit according to claim 3, wherein the first operation signal is the voltage of the first node, and the second operation signal is the voltage of the third node.

8. The stage circuit according to claim 3, wherein the first operation signal is the voltage of the first node, and the second operation signal is the voltage of the second node.

9. The stage circuit according to claim 3, wherein the second substage circuit unit comprises:

a second output unit connected to the fourth input terminal and the second power input terminal, wherein the second output unit supplies the second scan signal to the second output terminal in response to a voltage of a fourth node and a voltage of a fifth node;

a third driver connected to the third input terminal, the first power input terminal, the second power input terminal, a sixth node, and a seventh node, wherein the third driver controls the voltage of the fifth node in response to the second operation signal supplied to the sixth node and the first operation signal supplied to the seventh node; and a fourth driver connected to the third input terminal, the second power input terminal, and the sixth node, wherein the fourth driver controls the voltage of the fourth node, and the sixth node is the same node as the third node, and the seventh node is the same node as the first node.

10. The stage circuit according to claim 9, wherein the third driver comprises:

a first transistor connected between the fifth node and the seventh node and having a gate electrode connected to the second power input terminal;

a second transistor connected between the third input terminal and an eighth node and having a gate electrode connected to the fifth node;

a third transistor connected between the first power input terminal and the eighth node and having a gate electrode connected to the sixth node; and a capacitor connected between the fifth node and the eighth node.

11. The stage circuit according to claim 9, wherein the fourth driver comprises:

a first transistor connected between the fifth node and an eighth node and having a gate electrode connected to the second power input terminal;

a second transistor connected between the third input terminal and a ninth node and having a gate electrode connected to the eighth node;

a third transistor connected between the fourth node and the ninth node and having a gate electrode connected to the third input terminal; and a capacitor connected between the eighth node and the ninth node.

12. The stage circuit according to claim 9, wherein the second output unit comprises:

a first transistor connected between the fourth node and the fourth input terminal and having a gate electrode connected to the fifth node;

a second transistor connected between the fourth input terminal and the second output terminal and having a gate electrode connected to the fourth node;

a third transistor connected between the second power input terminal and the second output terminal and having a gate electrode connected to the fifth node; and a capacitor connected between the fourth input terminal and the fourth node.

13. The stage circuit according to claim 2, wherein the first clock signal and the second clock signal have a same period, and a high voltage supply period is set to be longer than a low voltage supply period in one period, the second clock signal is set to a signal shifted by half a period from the first clock signal, and the third clock signal is a signal having a phase inverted from a phase of the second clock signal.

14. The stage circuit according to claim 1, wherein the start signal is a first scan signal of a previous first substage circuit unit or a scan start signal.

15. A scan driver, comprising:

a plurality of stage circuits configured to supply a first scan signal including a pulse of a low voltage level to first scan lines and a second scan signal including a pulse of a high voltage level to second scan lines, wherein each of the plurality of stage circuits comprises:

a first substage circuit unit connected to a first input terminal, a second input terminal, and a third input terminal, wherein the first substage circuit unit generates a first operation signal and a second operation signal based on voltages of the first input terminal, the second input terminal, and the third input terminal, and supplies the first scan signal to a first output terminal based on the first operation signal and the second operation signal; and a second substage circuit unit connected to the third input terminal and a fourth input terminal, wherein the second substage circuit unit supplies the second scan signal to a second output terminal based on the first operation signal, the second operation signal, a voltage of the third input terminal, and a voltage of the fourth input terminal, wherein the second input terminal, the third input terminal, and the fourth input terminal receive different clock signals from one another.

16. The scan driver according to claim 15, wherein the first substage circuit unit comprises:

a first output unit connected to the third input terminal and a first power input terminal, wherein the first output unit supplies the first scan signal to the first output terminal in response to a voltage of a first node and a voltage of a second node;

a first driver connected to the first input terminal, the second input terminal, a third input terminal, and the first power input terminal, wherein the first driver controls a voltage of a third node; and a second driver connected to the second input terminal, the first power input terminal, the second power input terminal, and the third node, wherein the second driver controls the voltage of the first node and the voltage of the second node, and the first power input terminal supplies a gate-off voltage and the second power input terminal supplies a gate-on voltage.

17. The scan driver according to claim 16, wherein the second substage circuit unit comprises:

a second output unit connected to the fourth input terminal and the second power input terminal, wherein the second output unit supplies the second scan signal to the second output terminal in response to a voltage of a fourth node and a voltage of a fifth node;

a third driver connected to the third input terminal, the first power input terminal, the second power input terminal, a sixth node, and a seventh node, wherein the third driver controls the voltage of the fifth node in response to the second operation signal supplied to the sixth node and the first operation signal supplied to the seventh node; and a fourth driver connected to the third input terminal, the second power input terminal, and the sixth node, wherein the fourth driver controls the voltage of the fourth node.

18. The scan driver according to claim 15, wherein the second input terminal receives a first clock signal, the third input terminal receives a second clock signal, and the fourth input terminal receives a third clock signal in an odd-numbered stage, and the second input terminal receives the second clock signal, the third input terminal receives the first clock signal, and the fourth input terminal receives a fourth clock signal in an even-numbered stage.

19. The scan driver according to claim 18, wherein the first clock signal and the second clock signal have a same period, and a high voltage supply period is set to be longer than a low voltage supply period in one period of the first clock signal and the second clock signal, the second clock signal is set to a signal shifted by half a period from the first clock signal, the third clock signal and the fourth clock signal have a same period, and a high voltage supply period is set to be shorter than a low voltage supply period in one period of the third clock signal and the fourth clock signal, and the fourth clock signal is set to a signal shifted by half a period from the third clock signal.

20. The scan driver according to claim 19, wherein the third clock signal is a signal having a phase inverted from a phase of the second clock signal, and the fourth clock signal is a signal having a phase inverted from a phase of the first clock signal.

* * * * *